(12) United States Patent
Asano et al.

(10) Patent No.: US 6,335,129 B1
(45) Date of Patent: Jan. 1, 2002

(54) METHOD FOR REPAIRING PATTERN DEFECT, PHOTO MASK USING THE METHOD, AND SEMICONDUCTOR DEVICE MANUFACTURING METHOD EMPLOYING THE PHOTO MASK

(75) Inventors: Mitsuyo Asano, Yokohama; Shingo Kanamitsu, Fuchu, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/524,963

(22) Filed: Mar. 14, 2000

(30) Foreign Application Priority Data

Mar. 15, 1999 (JP) .......................................... 11-068525

(51) Int. Cl.$^7$ .............................. G03F 9/00; G21K 5/10
(52) U.S. Cl. ....................................... 430/5; 250/492.21
(58) Field of Search .................. 430/5, 20; 250/492.21, 250/492.22, 492.3; 382/144; 356/239.9, 239.3

(56) References Cited

U.S. PATENT DOCUMENTS

| 5,429,730 | A | | 7/1995 | Nakamura et al. ..... 204/192.34 |
| 5,639,699 | A | | 6/1997 | Nakamura et al. .......... 437/238 |
| 5,882,823 | A | * | 3/1999 | Neary ............................. 430/5 |
| 6,156,461 | A | * | 12/2000 | Grenon et al. ................. 430/5 |

FOREIGN PATENT DOCUMENTS

| JP | 5-313354 | 11/1993 |
| JP | 7-28228 | 1/1995 |
| JP | 7-333828 | 12/1995 |
| JP | 10-161293 | 6/1998 |
| JP | 11-202474 | 7/1999 |

OTHER PUBLICATIONS

Kazuo Aita et al., "New Technique for Repairing Opaque Defects," Proc. SPIE vol. 2512, pp. 412–419, Jun. 1995.
Yasushi Satoh et al., "Performance of Gas Assist FIB Repair for Opaque Defects," SPIE vol. 2884, pp. 124–137, Jul. 1996.
J. David Casey, Jr., et al., "Chemically Enhanced FIB Repair of Opaque Defects on Chrome Photomasks," Proc. SPIE vol. 3096, pp. 322–332, 1997.
Kazuhiro Sawada et al., "Built–In Self–Repair Circuit for High–Density ASMIC," IEEE 1989 Custom Integrated Circuits Conference, pp. 26.1 1–26.1.4, 1989.
Tadahiro Kuroda et al., "Variable Supply–Voltage Scheme for Low–Power High–Speed CMOS Digital Design," IEEE J. of Solid–State Circuits, vol. 33, No. 3, Mar. 1998, pp. 454–461.

* cited by examiner

*Primary Examiner*—S. Rosasco
(74) *Attorney, Agent, or Firm*—Finnegan, Henderson, Farabow, Garrett, and Dunner, L.L.P.

(57) ABSTRACT

A new method for repairing pattern defect on a photo mask is provided. The method includes the steps of: (a) determining the irradiation area of the focused ion beam (FIB) directed towards a defect, by narrowing the irradiation area by a predetermined distance inwardly from the edge of the defect; (b) focusing the FIB onto its irradiation area to remove a part of the pattern film material of the defect from its top surface and thus leave a thin layer on a mask substrate; and (c) removing the thin layer by using a laser beam. The defect may be an isolated pattern or a pattern extended continuously from an edge of the normal pattern. Further, the photo mask repaired by the method, and a manufacturing method of semiconductor devices employing the repaired photo mask are proposed. The photo mask may include a phase shift mask.

20 Claims, 25 Drawing Sheets

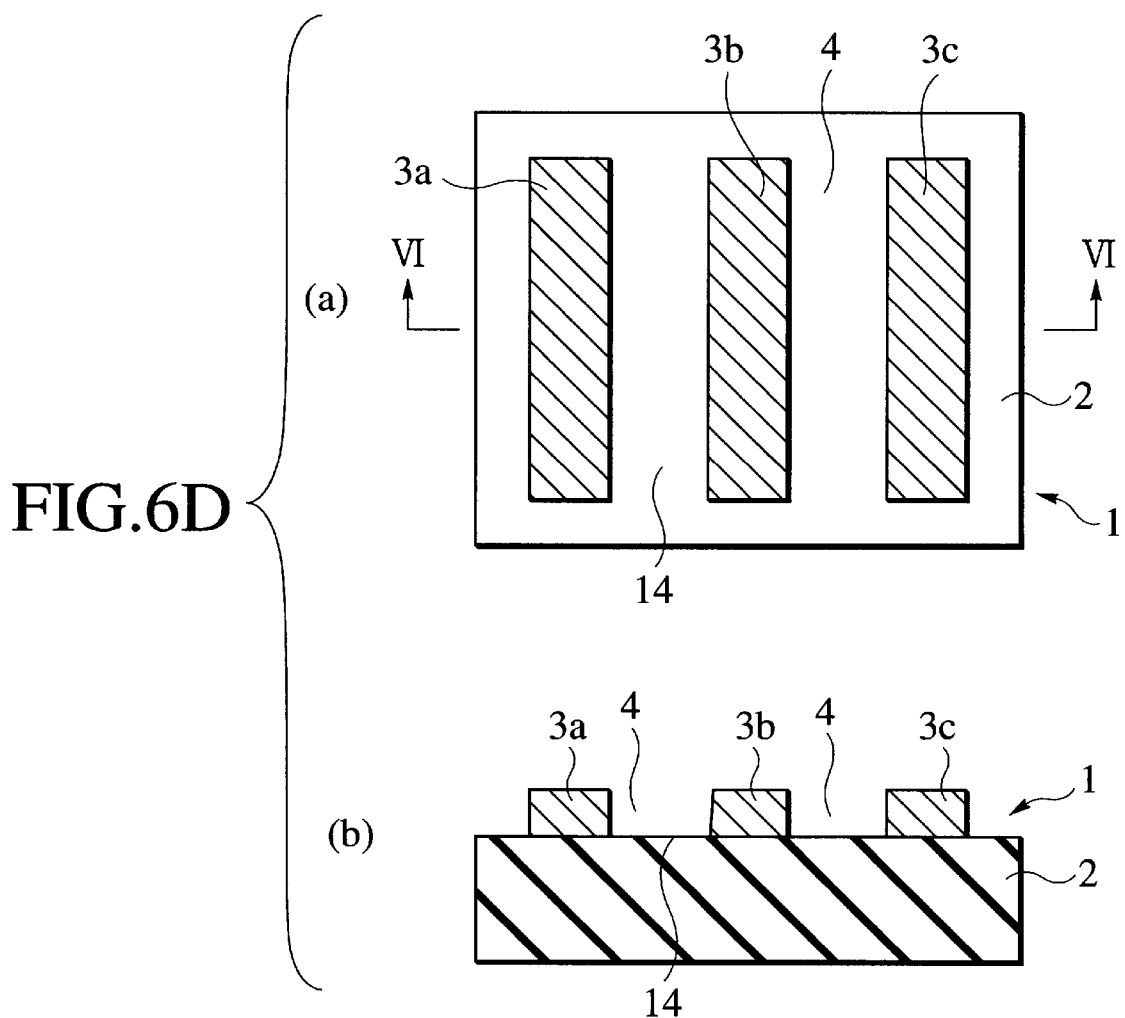

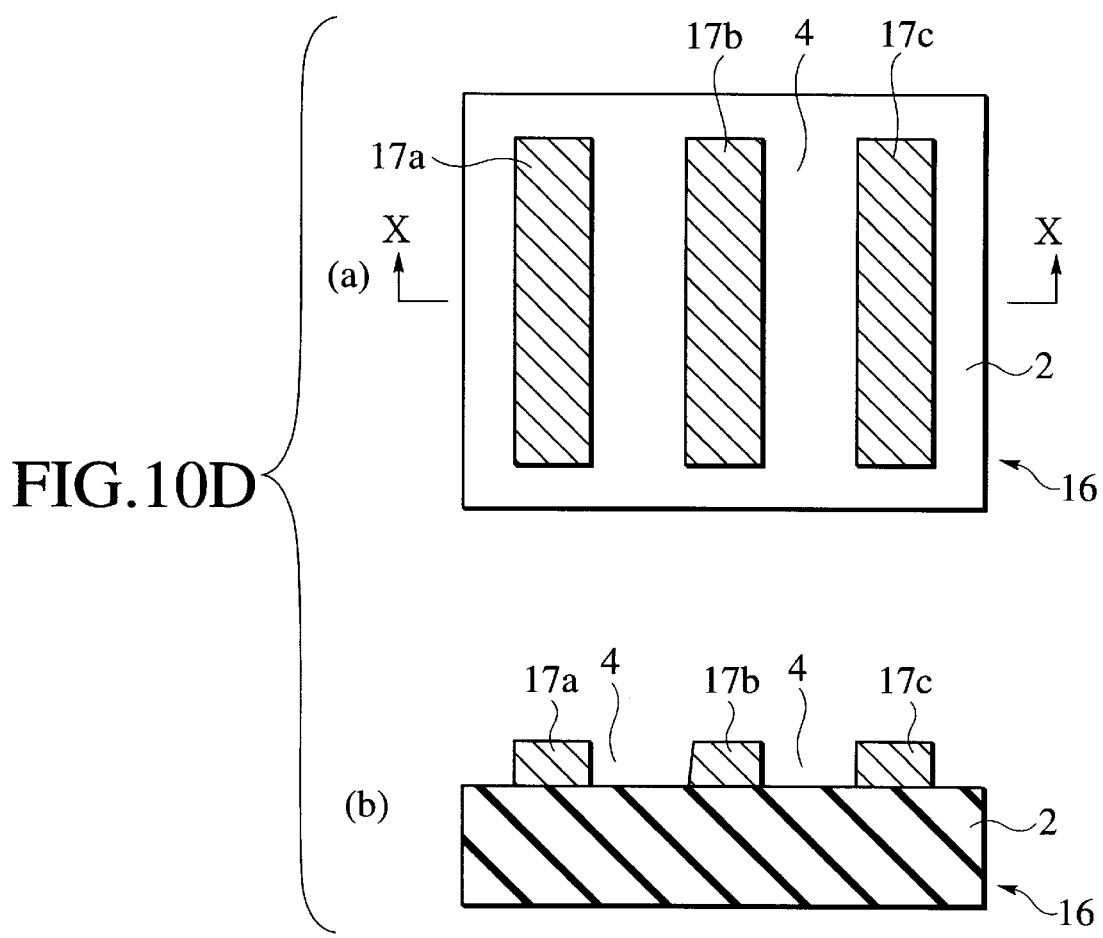

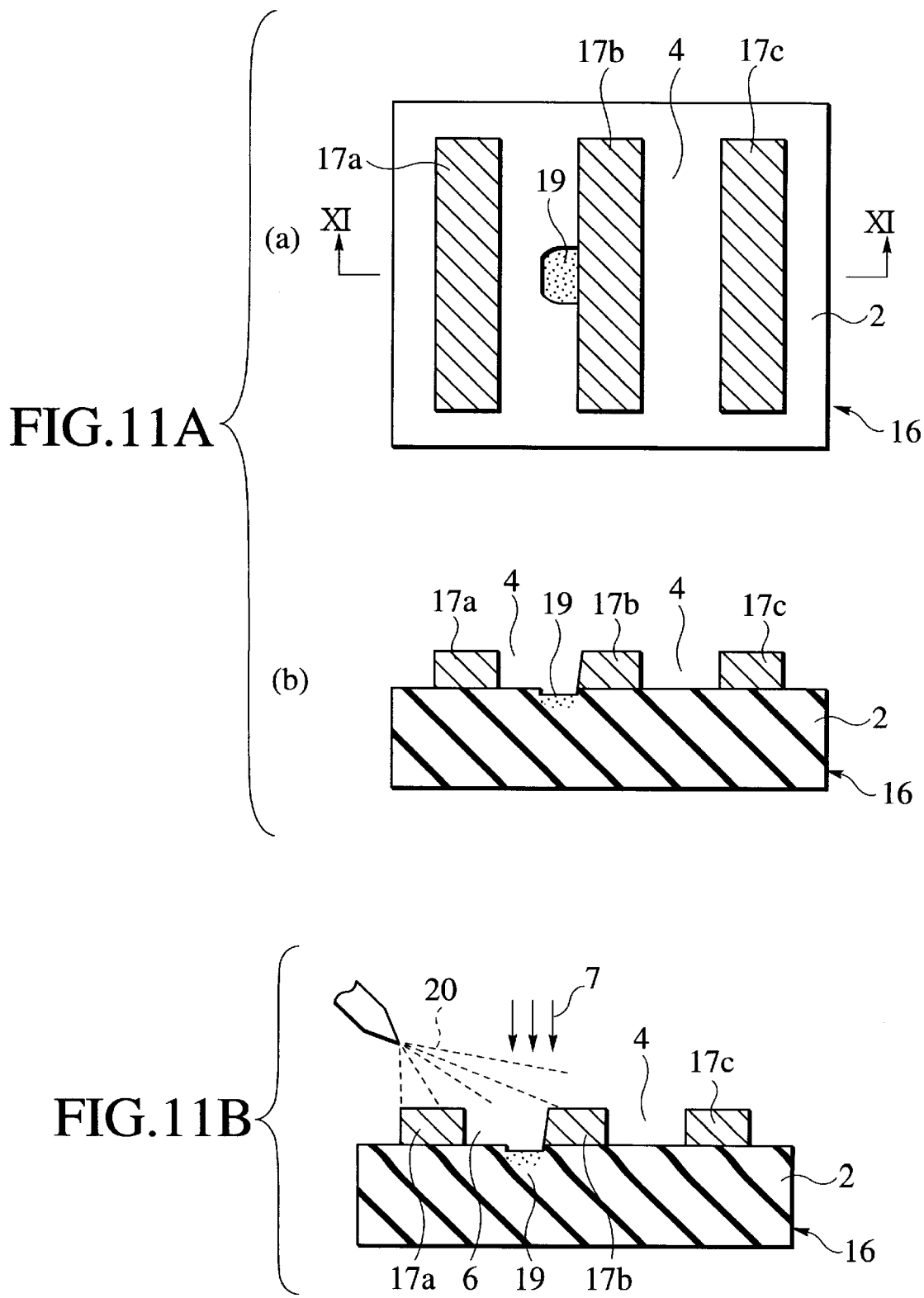

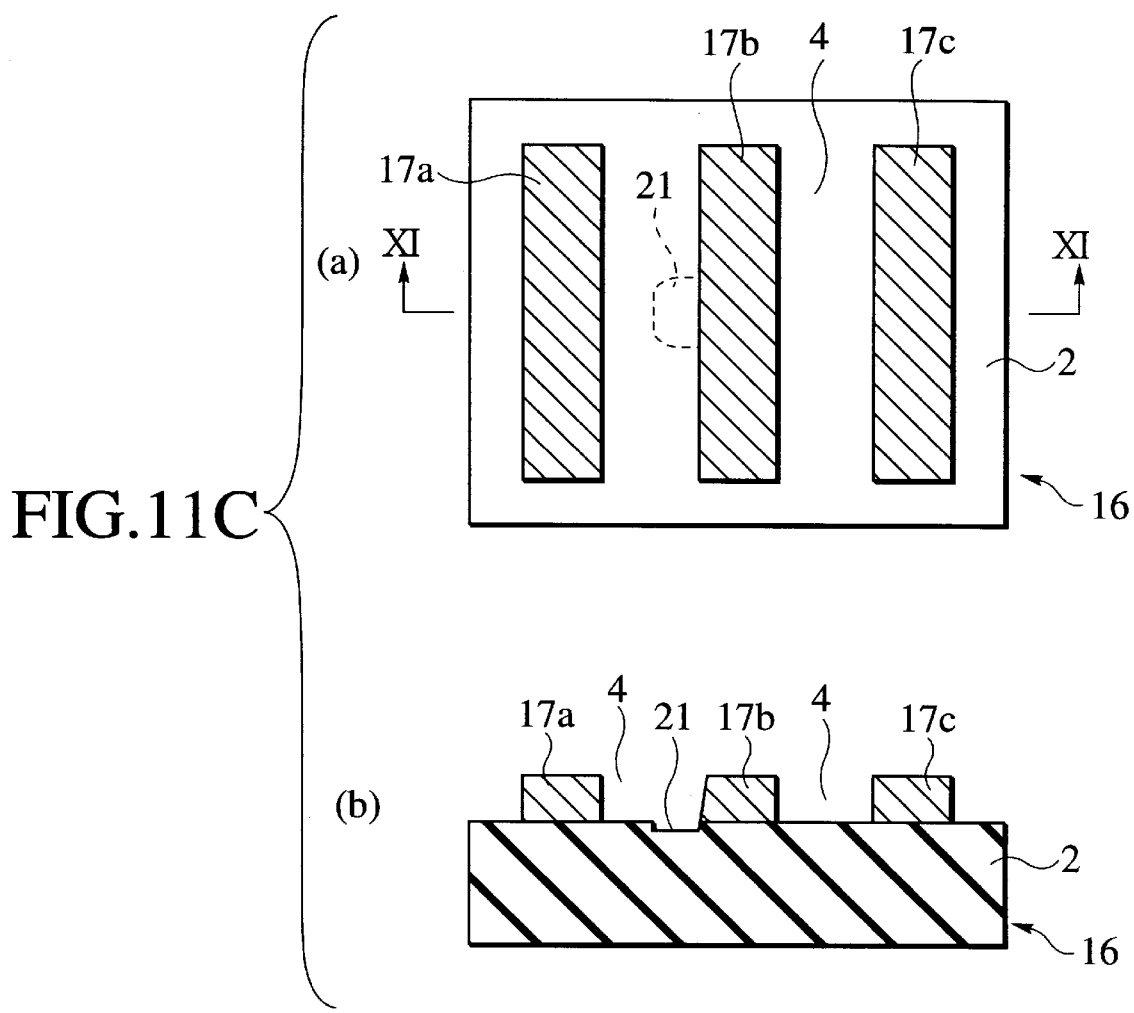

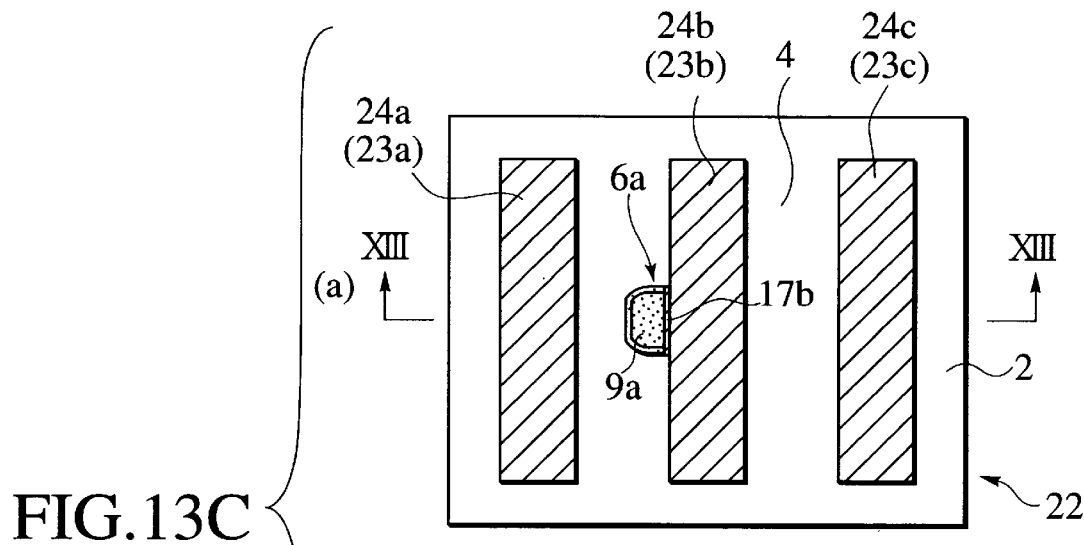
FIG. 13C
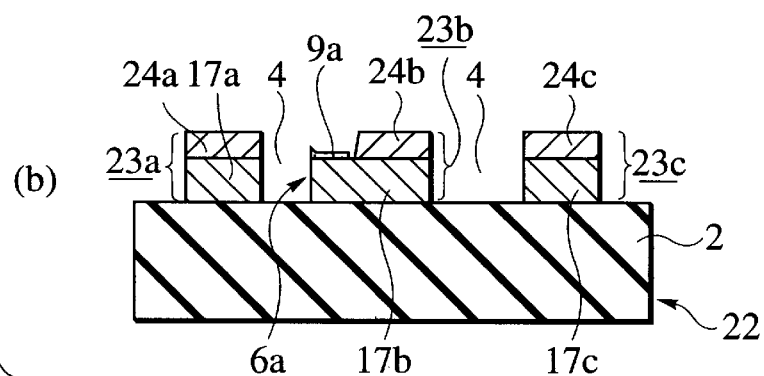
FIG. 13D
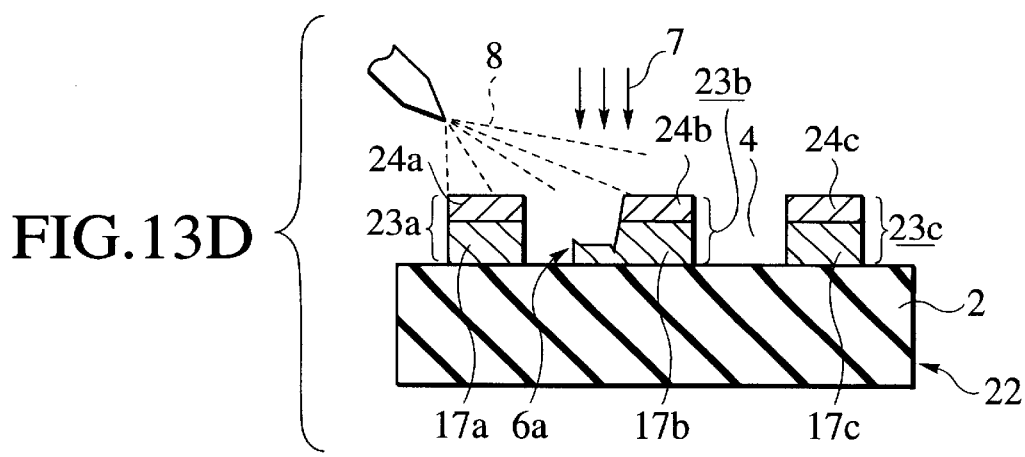

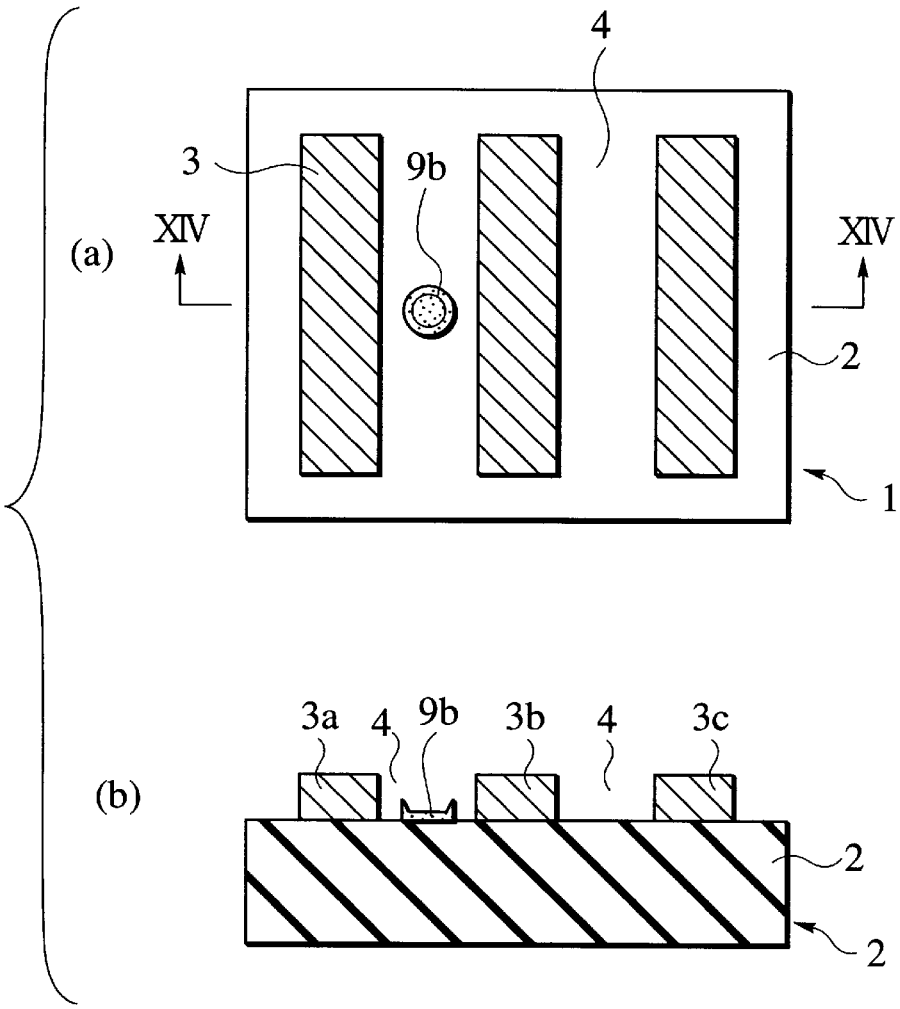

FIG.20

- n-SUB  n=1×10$^{15}$ cm$^{-3}$ (PHOS)
- FIRST PHOTOLITHOGRAPHY
- Si$_3$N$_4$ PATTERN FORMATION
- CHANNEL-STOP BORON (B) I/I 100keV 1×10$^{13}$ cm$^{-2}$
- LOCOS T$_{OX}$ 600nm
- Si$_3$N$_4$ STRIPPING
- SECOND PHOTOLITHOGRAPHY
- p-WELL BORON (B) I/I 160keV 5×10$^{12}$ cm$^{-3}$
- p-WELL DRIVE-IN
- DUMMY OXIDATION T$_{OX}$ 10nm
- THIRD PHOTOLITHOGRAPHY
- Vth CONTROL I/I BORON (B) 10keV 7×10$^{12}$ cm$^{-2}$
- FOURTH PHOTOLITHOGRAPHY
- PUNCH-THROUGH PROTECTION I/I BORON (B) 80keV 5×10$^{12}$ cm$^{-2}$
- DUMMY OXIDE-FILM STRIPPING/GATE OXIDATION T$_{OX}$ 10nm
- POLY-Si CVD
- FIFTH PHOTOLITHOGRAPHY
- GATE POLY-Si CUT
- POST-OXIDATION
- SIXTH PHOTOLITHOGRAPHY
- S/D I/I ARSENIC (As) 30keV 5×10$^{15}$ cm$^{-2}$
- SiO$_2$ CVD
- S/D ACTIVATION ANNEAL
- SEVENTH PHOTOLITHOGRAPHY
- CONTACT HOLE CUT
- METALIZATION WITH EIGHTH PHOTOLITHOGRAPHY

METHOD FOR REPAIRING PATTERN DEFECT, PHOTO MASK USING THE METHOD, AND SEMICONDUCTOR DEVICE MANUFACTURING METHOD EMPLOYING THE PHOTO MASK

BACKGROUND OF THE INVENTION

1. Field of the Invention

The present invention relates to a method for repairing a pattern defect on a photo mask, the photo mask repaired by the repairing method, and a manufacturing method of semiconductor devices employing the repaired photo mask. The photo mask may include a phase shift mask.

2. Description of the Related Art

In the manufacturing method of the semiconductor devices such as large scale integrations (LSIs), very large scale integrations (VLSIs), ultra large scale integrations (ULSIs), and giga scale integrations (GSIs), a set of photo masks or reticles is required for photolithography steps. Each of the photo masks is composed of predetermined patterns made of a light-shielding layer or phase shift layer arranged on a transparent mask substrate, such as a quartz substrate. During the fabrication process of the photo masks, miscellaneous microscopic defects 6a, 6b, 6c may be created on the mask substrate as shown in FIGS. 1A, 1B and 1C, for example. In each of FIGS. 1A to 1C, three lines 3a, 3b, and 3c made of the light-shielding layer are shown, sandwiching spaces 4 and 4 between them. In FIG. 1A, a defect 6a protruding from the left edge of line 3b is shown. In FIG. 1B, an isolated defect 6b is shown, but very close to the left edge of line 3b. And in FIG. 1C, an isolated defect 6c is shown disposed midway between lines 3a and 3b. The defects 6a, 6b, 6c can be commonly evaporated and eliminated when exposed to a laser beam. As a result of the exposure to a laser beam, the left edge of line pattern 3b may develop "a mouse-nip" or "a rat-bite" as shown in FIG. 2A. Or, although not shown, the left edge of line pattern 3b may develop a peeling. Or, an edge-roughness may be created on the left edge of line 3b as shown in FIG. 2B, which fails to finish in a desired normal line shape. As the feature size of such a photo mask pattern becomes significantly finer and finer, its repairing process at a high accuracy will be very difficult with a laser beam scanning precisely along the edge of the line pattern. Also, since the focusing of the laser beam is limited, the pattern defect repairing at higher accuracy, which may require a laser beam diameter finer than 0.5 μm, will thus be a troublesome task.

Also, mask repairing for removing defects may be carried out by a sputtering method using a focused ion beam (FIB). It is known that when the ion beam is directed to an irradiation area on the mask substrate made of quartz, its gallium (Ga) ions from an ion source are implanted into the quartz substrate, which generates gallium stains and hence decreases the transparency of the substrate. Moreover, the diffused FIB and the beam expansion of the FIB may result in excessive etching around the perimeter of the microscopic defect that needs to be eliminated. The excessive etching generally produces V-shaped grooves around the periphery of the microscopic defect, which are also known as "riverbeds."

For solving the above problems, etching a chromium (Cr) film by "a gas assisted FIB etching process" is proposed as the pattern defect repairing method for removing the microscopic defect generated on a chromium mask. (K. Aita et al., SPIE, vol. 2512, p. 412 (1995), and J. David Casey, Jr. et al., SPIE, vol. 3096, pp. 322–332 (1997)). Here, the chromium mask has the light-shielding layer of a chromium (Cr) film or a chromium compound film such as chromium oxide ($CrO_x$) film for delineating the required pattern on the quartz substrate. By the gas assisted FIB etching process, the gallium stains or riverbeds are reported to have been eliminated. It is reported that a mask pattern repaired by the above-mentioned pattern defect repairing method could produce an acceptable image level projected with an i-line at a wavelength of 365 nm. In the gas assisted FIB etching process, an etching gas is employed with a high selectivity of etching rates between the mask substrate and the chromium film or the chromium oxide film.

However, it was found that, in finer masks used for exposure by Deep UV (DUV) rays or further shorter wavelength rays, the chromium film repaired by the gas assisted FIB etching process still has noticeable damages to the mask substrate, attributable to the gallium stains or the riverbed.

FIG. 3 is a plan view of a repaired photo mask corresponding to FIG. 1A, which has been repaired by the gas assisted FIB etching process. The chromium mask 1 has an etching burn 5a generated at the aperture 4, very closely disposed to the left edge of line 3b, from removing the microscopic defect 6a with the gas assisted FIB etching process. FIG. 4 is a diagram showing the image intensity profile taken along the line III—III of FIG. 3 on a wafer on which an image of the repaired mask pattern is projected. The ordinate in FIG. 4 represents the intensity of the projected image and the abscissa represents locations on the wafer (along a predetermined axis, such as the X axis). In FIG. 4, "S" represents the position of the repaired space between lines 3a and 3b, and "L" represents the position of line 3b. It is assumed that the exposure conditions in a stepper loading the chromium mask (reticle) are as follows:

| [007] | the exposure wavelength | $\lambda = 248$ nm; |
|---|---|---|
| [008] | the aperture number | $NA = 0.6$; and |
| [009] | the coherence factor | $\gamma = 0.75$. |

As apparent from FIG. 4, the intensity at the etching burn 5a in the aperture of the repaired mask is decreased by more than 20% from that of a non-defect region of the mask. In this way, the unrequired etching burn 5a was unfavorably transferred onto the wafer.

The gas assisted FIB etching process may rarely be effective for repairing microscopic defect on a phase shift mask when it is made of a silicon based material such as molybdenum silicide (MoSi, or $MoSi_x$) and used as the film material for producing the light-shielding pattern or the phase shifter pattern. In a step of imaging with the FIB, the phase shifter film may easily be charged up thus interrupting the projection of an image at a higher signal to noise (S/N) ratio and rendering the end point of the etching process hardly detectable with a higher accuracy.

SUMMARY OF THE INVENTION

The present invention has been achieved with a view of the foregoing features and its object is to provide a method for repairing a pattern defect, in which the damage against the transparent substrate of a mask is minimized.

Another object of the present invention is to provide a method for repairing a pattern defect, in which the etching of the surface of the transparent substrate of a mask is minimized.

It is still another object of the present invention to provide a method for repairing a pattern defect, suppressing a change in the image intensity through the mask, thereby having a favorable level of the wafer process margin.

It is still another object of the present invention to provide a photo mask having fine pattern and a high transmissivity, having uniform image intensity profiles.

It is still another object of the present invention to provide a method for manufacturing semiconductor devices having miniaturized feature sizes, with a favorable level of the process margin in the lithography process.

A first feature of the present invention involves a method for repairing a defect generated on a mask substrate. The defect may be isolated from normal patterns, or continuous excess patterns protruding from the edge of the normal pattern. More particularly, the method for repairing the pattern defect according to the first feature of the present invention comprises the steps of: (a) determining the irradiation area of an ion beam directed towards a defect by narrowing the irradiation area by a predetermined distance inwardly from the edge of defect; (b) focusing the ion beam onto its irradiation area to remove a part of the defect from its surface so as to leave a thin layer of the defect on the mask substrate; and (c) removing the thin layer by using a laser beam.

According to the first feature of the present invention, a portion of the defect is etched by a FIB process capable of etching locally at a higher accuracy and fineness. Namely, a gas assisted FIB etching process or a FIB sputtering process may be used. While the predetermined distance from the edge of the defect inwardly narrows the irradiation area of the ion beam, the thin layer of the pattern film material is left so that the mask substrate beneath and around the defect is not exposed to the FIB, and then the thin layer is eliminated by exposure to the laser beam. Accordingly, the repairing method according to the first feature of the present invention enables one to perform the repairing process at a higher accuracy and processing facilitation without producing peelings, rat-bites, or edge-roughness. In fact, the pattern film material of the defect next to the edge of the normal pattern is completely eliminated, hence allowing the edge of the normal pattern to be contoured with a higher precision and a better finish. Also, the pattern defect repairing method according to the first feature of the present invention develops the thin layer, hence minimizing the implantation of FIB ions into the transparent mask substrate and the digging of the surface of the mask substrate. The thickness of the thin layer is smaller than that of the light-shielding pattern, allowing the laser beam to give minimum damage to the mask substrate. Damage to the mask substrate may result in deterioration of the transparency of the mask substrate. As damage to the mask substrate is kept to a minimum, a change in the image intensity caused during the pattern defect repairing can be suppressed, hence it is possible to provide a favorable level of the wafer process margin.

The second feature of the present invention lies in a photo mask, repaired by the method explained by the first feature. Namely, the photo mask of the second feature has a mask substrate having a substantially flat surface and pattern delineated on the mask substrate, the pattern has an edge, the edge has a localized specific side wall having an inclination angle differing from that of the remaining sidewall. The localized specific sidewall corresponds to the repaired portion, and can easily be recognized, since the specific sidewall is brighter than other edges in reflective images. The decrease in the image intensity through the mask substrate neighboring the specific sidewall is not higher than 5% compared with that of other portion, since damage to the mask substrate is kept to a minimum.

The third feature of the present invention lies in a method for manufacturing semiconductor device comprising the steps of: (a) generating pattern on a mask substrate so as to fabricate a photo mask; (b) inspecting a pattern defect on the mask substrate; (c) repairing a pattern defect by the method already stated in the first feature; and (d) fabricating a semiconductor device employing the repaired photo mask.

Other and further objects and features of the present invention will become obvious upon an understanding of the illustrative embodiments about to be described in connection with the accompanying drawings, or will be indicated in the appended claims, and various advantages not referred to herein will occur to one skilled in the art upon employing the invention in practice.

BRIEF DESCRIPTION OF DRAWINGS

FIG. 6D illustrates a plan view (a) and a cross sectional view (b) taken along the line VI—VI of the plan view (a), explaining the mask defect repairing method according to the first embodiment of the present invention;

FIG. 10C is a plan view of the phase shift mask explaining the mask defect repairing method according to the second embodiment of the present invention;

FIG. 10D illustrates a plan view (a) and a cross sectional view (b) taken along the line X—X of the plan view (a), explaining the mask defect repairing method according to the second embodiment of the present invention;

FIG. 11A illustrates a plan view (a) and a cross sectional view (b) taken along the line XI—XI of the plan view (a), explaining the mask defect repairing method according to the modification of second embodiment of the present invention;

FIG. 11B is a cross sectional view of the phase shift mask explaining the mask defect repairing method according to the modification of the second embodiment of the present invention;

FIG. 11C illustrates a plan view (a) and a cross sectional view (b) taken along the line XI—XI of the plan view (a), explaining the mask defect repairing method according to the modification of second embodiment of the present invention;

FIG. 13C illustrates a plan view (a) and a cross sectional view (b) taken along the line XIII—XIII of the plan view (a), explaining the mask defect repairing method according to the third embodiment of the present invention;

FIG. 13D is a plan view of the phase shift mask explaining the mask defect repairing method according to the third embodiment of the present invention;

FIG. 14 illustrates a plan view (a) and a cross sectional view (b) taken along the line XIV—XIV of the plan view (a), explaining the mask defect repairing method according to the fourth embodiment of the present invention;

FIG. 20 illustrates a relatively simple manufacturing processes of an nMOS FET.

DETAILED DESCRIPTION OF THE PREFERRED EMBODIMENTS

Figure 1A:
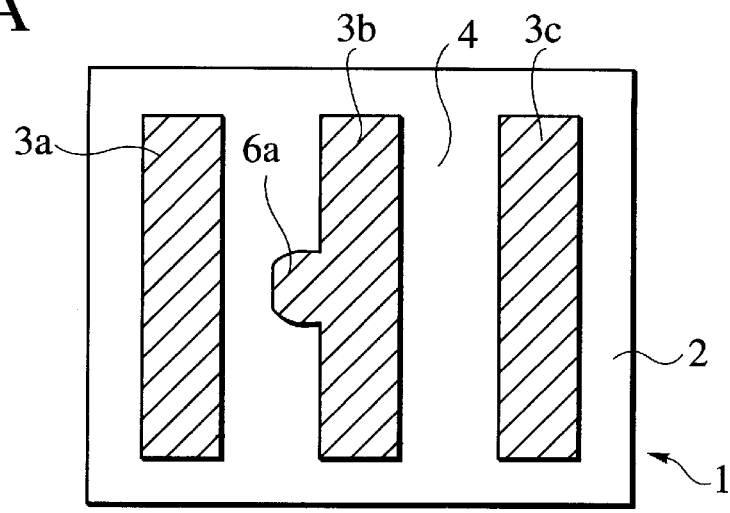
FIG. 1A is a plan view of a mask pattern showing a example of pattern defect formed on the mask substrate.
Figure 1B:
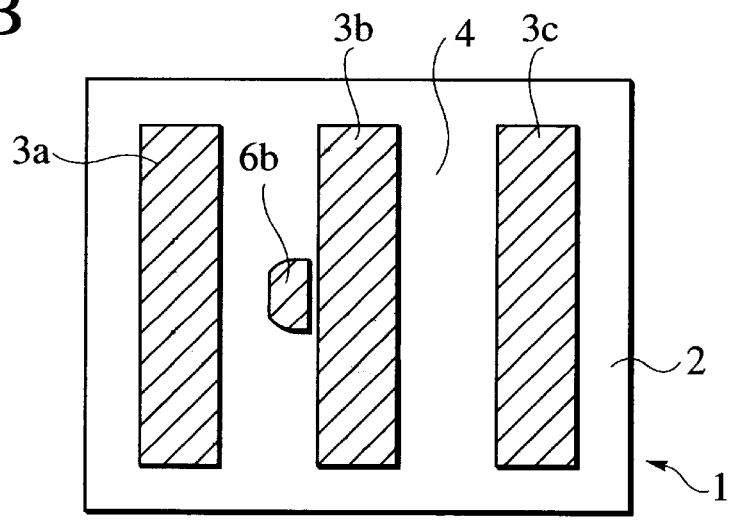
FIG. 1B is a plan view of a mask pattern showing another example of pattern defect formed on the mask substrate.

Various embodiments of the present invention will be described with reference to the accompanying drawings. It is noted that the same or similar reference numerals are applied to the same or similar parts and elements throughout the drawings, and the description of the same or similar parts and elements will be omitted or simplified. Generally, and as is conventional in the representation of photo masks, it will be appreciated that the various drawings are not drawn to scale from one figure to another nor inside a given figure, and in particular that the layer thicknesses are arbitrarily drawn for facilitating the reading of the drawings. In the following descriptions, numerous specific details are set fourth such as specific signal values, etc., to provide a thorough understanding of the present invention. However, it will be obvious to those skilled in the art that the present invention may be practiced without such specific details.

FIRST EMBODIMENT

Figure 5:
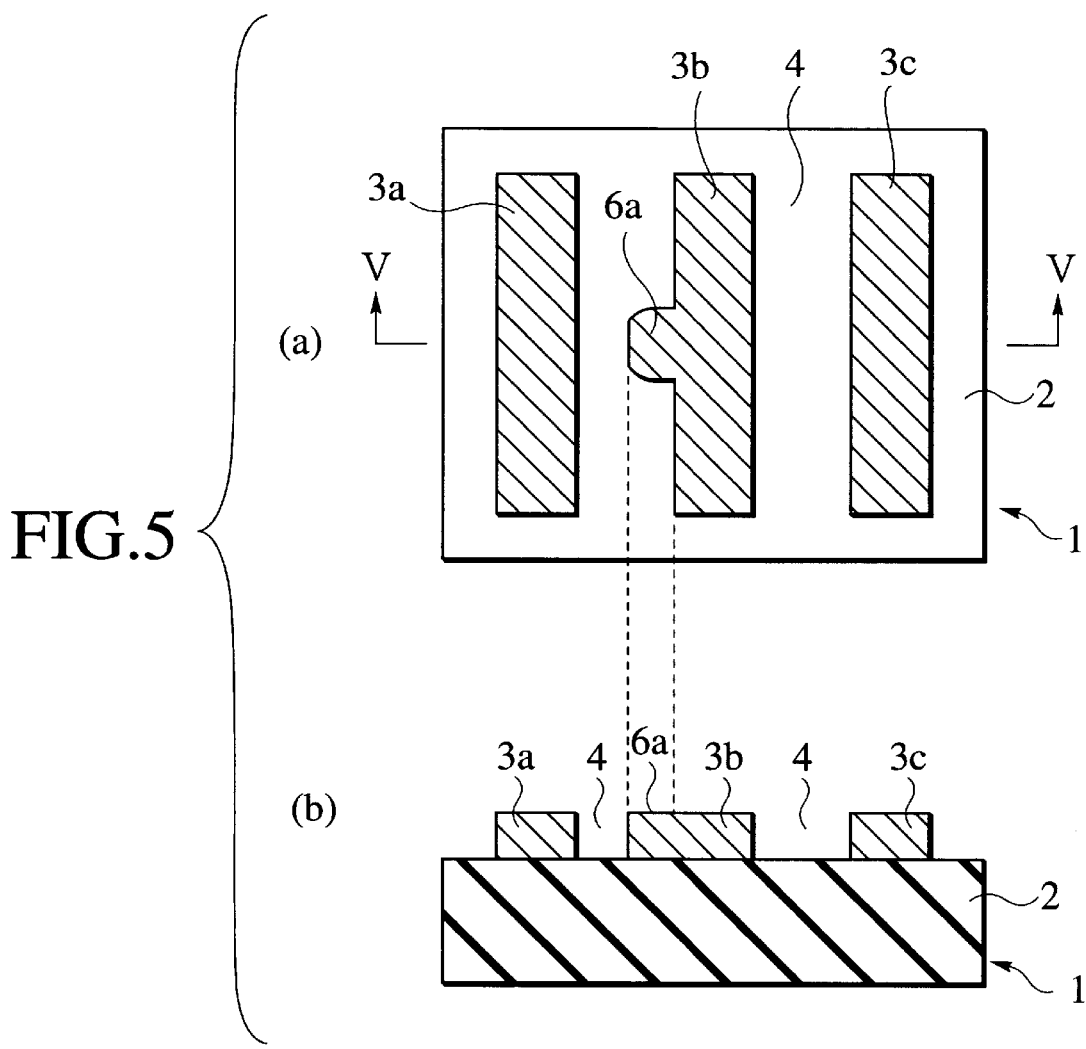
FIG. 5 illustrates a plan view (a) and a cross sectional view (b) taken along the line V—V of the plan view (a), showing a chromium mask having a microscopic defect which is to be repaired according to the present invention.

As shown in FIG. 5, a mask repaired by a first embodiment of the present invention has chromium light-shielding lines 3a, 3b and 3c delineated on a transparent quartz substrate 2. In details, each of the chromium light-shielding lines 3a, 3b and 3c is composed of a layered structure consisting of a chromium layer and a chromium oxide layer provided on the chromium layer. The layered structure is referred as "the chromium light-shielding layer", or"the chromium light-shielding line" hereinafter. The mask in the first embodiment of the present invention is 4× the size of circuit to be printed on a wafer. In the first embodiment of the present invention, the line width of the chromium light-shielding lines 3a, 3b and 3c is assumed to be 0.9 $\mu$m and the width of the space portion 4 is assumed to be 1.1 $\mu$m. And the microscopic defect 6a is extending from the left edge of the line 3b. It is commonly appreciated that more intricate rectangle patterns than such a simple line and space pattern may equally be employed.

The mask defect repairing method according to the first embodiment of the present invention will now be described. Here, an excessive portion of the pattern film material, or the microscopic defect 6a generated on the chromium mask 1, will be eliminated. The chromium mask 1 has the chromium light-shielding lines 3a, 3b and 3c delineated on the quartz substrate 2 as shown in FIG. 5.

Figure 6A:
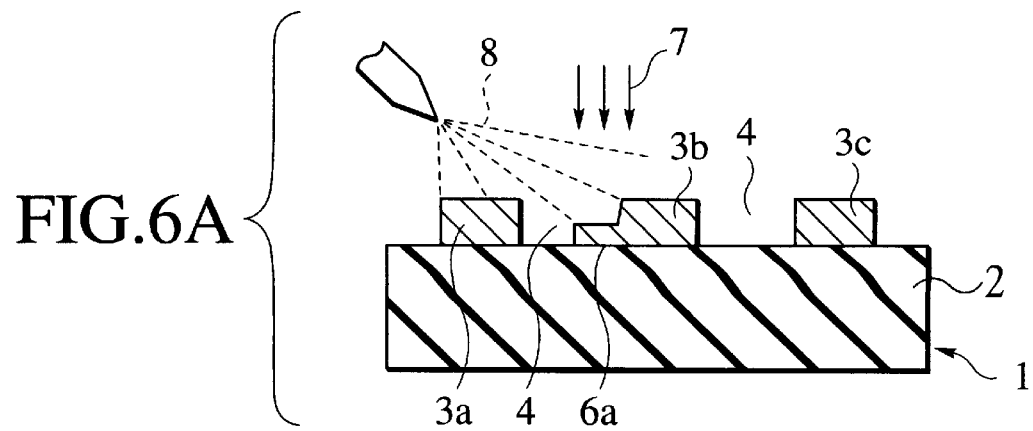
FIG. 6A is a cross section view of the chromium mask explaining a mask defect repairing method according to a first embodiment of the present invention.
Figure 7A:
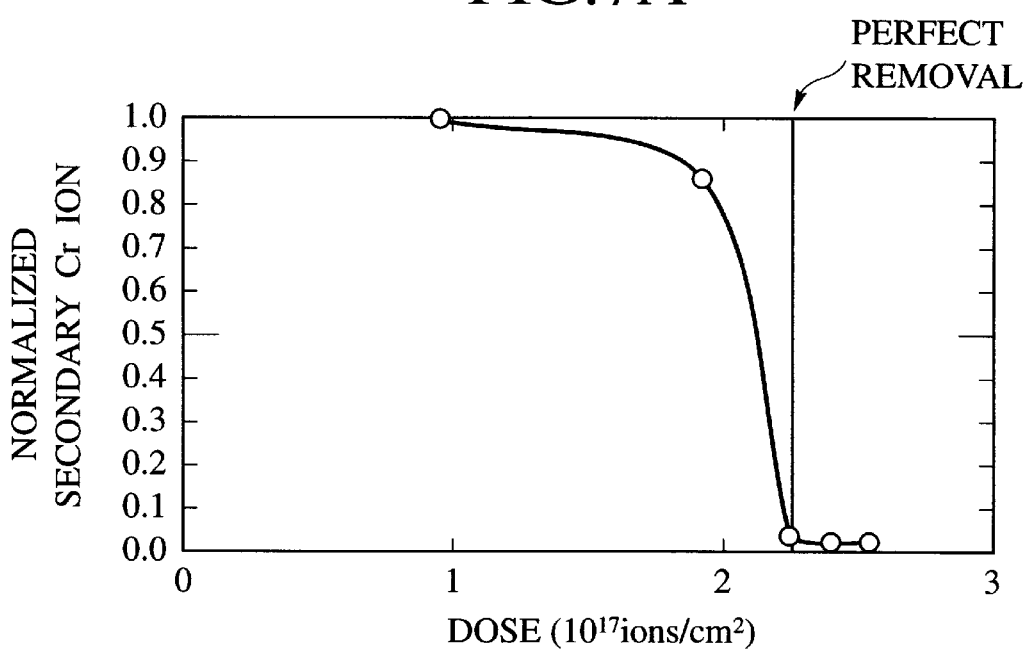
FIG. 7A shows the relation between the detected secondary chromium ions and dose amount.
Figure 7B:
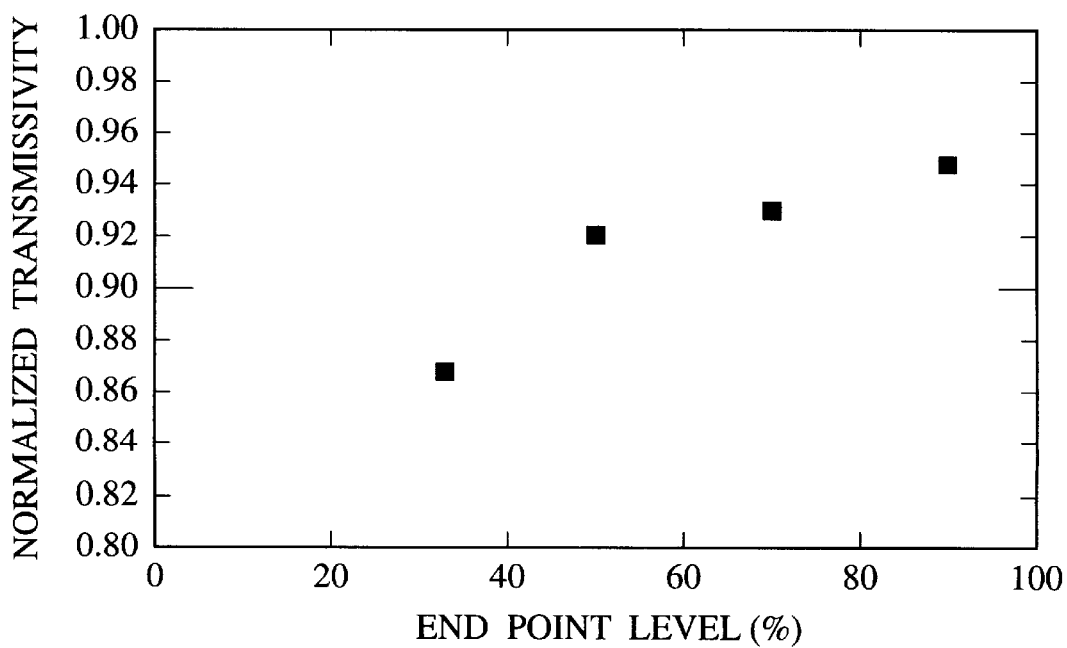
FIG. 7B shows the variation of the transmissivity of the repaired portion by the change of the end point detection level in the gas assist FIB etching of the chromium film.

(a) First, as shown in FIG. 6A, the microscopic defect 6a is sputtered by a FIB 7 with an assistant gas 8 for chromium film etching. The assistant gas 8 is sprayed over the mask surface. In other words, a gas assisted FIB etching process carries out the etching. As described in the section of BACKGROUND OF THE INVENTION, riverbeds may possibly be created around the microscopic defect 6a by the effect of a diffused FIB or beam expansion of the FIB. For compensation, the exposure area about the microscopic defect 6a to the ion beam, directed towards the transparent quartz substrate 2, is inwardly narrowed by 0.3 nm to 200 nm from the edge of the microscopic defect 6a. Preferably, it is narrowed by a half of the FIB diameter. As FIB ion source, gallium ions are employed. The FIB has an accelerating voltage of 20 kV and a current of 50±10 pA with a beam diameter 0.2 μm. As half of the beam diameter of FIB is 0.1 μm, the exposure area to the ion beam is inwardly narrowed by 100 nm from the edge of the microscopic defect 6a. The end point of the etching is determined by counting the number of chromium ions in the etched region with a secondary ion detector. As the etching proceeds, reduced the thickness of a chromium light-shielding layer of the microscopic defect 6a approaching the point where the surface of the quartz substrate is exposed, and the number of chromium ions decreases as shown in FIG. 7A. In FIG. 7A, the detected secondary chromium ions are normalized to the secondary chromium ions at starting point of etching. The dose amount by which the chromium light-shielding film is completely removed is shown by vertical line. When the quartz substrate beneath the chromium light-shielding layer appears, the number of chromium ions drops below the noise level. FIG. 7B shows the variation of the transmissivity of the repaired portion by the change of the end point detection level in the gas assist FIB etching of the chromium film. The abscissa represents the end point detection level, which defines the level at which the etching is to be finished. Namely the end point detection level is defined as a ratio (%) of the chromium secondary ion count number under etching to the initial chromium ion count number. The ordinate represents the normalized transmissivity of the repaired portion, taking the transmissivity of quartz substrate to be 1. In FIG. 7B, it is shown that the transmissivity becomes higher as the end point detection level is higher. In short, transmissivity lowering by the gas assist FIB etching of the chromium is smaller, when a thin film remains, such that the chromium secondary ion can be detected, as opposed to the case where the etching has proceeded to the point where the surface of the quartz substrate is nearly exposed. In the pattern defect repairing method of the first embodiment of the present invention, the etching is finished when the number of chromium ions is decreased to 70 to 80% in the end point detection level, before the quartz substrate beneath the microscopic defect 6a is completely exposed to the FIB 7.

Figure 6B:
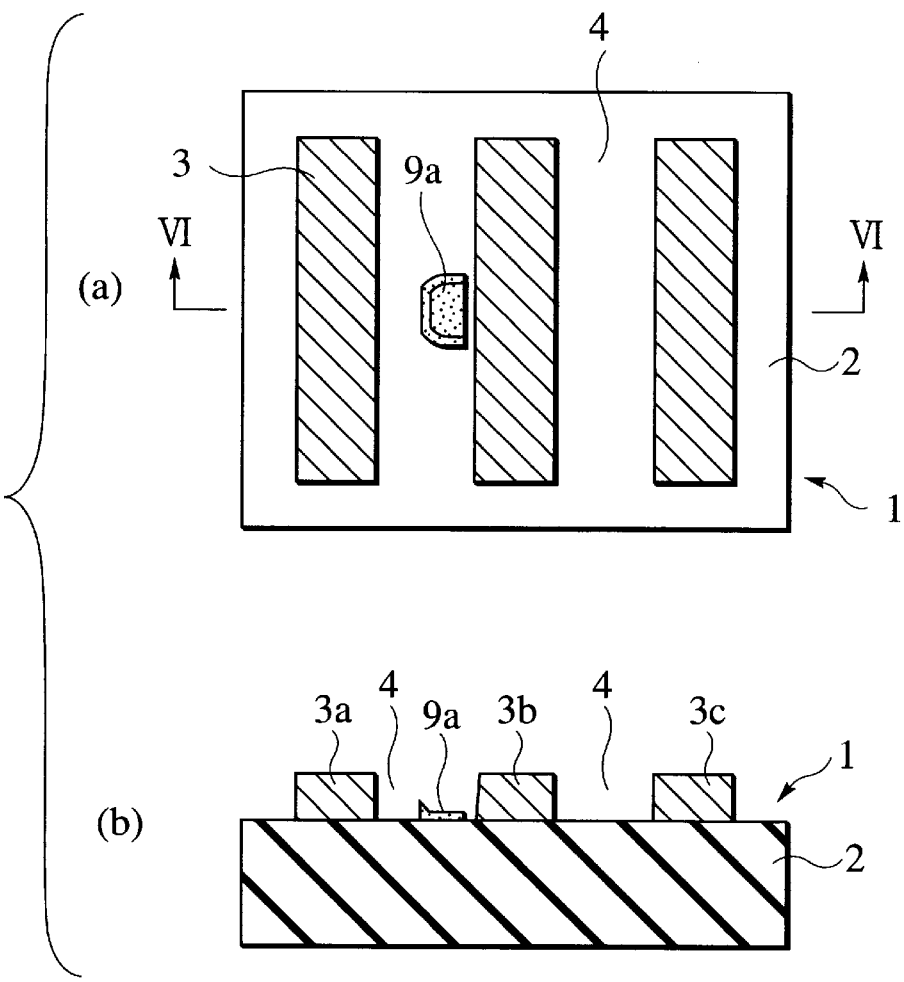
FIG. 6B illustrates a plan view (a) and a cross sectional view (b) taken along the line VI—VI of the plan view (a), explaining the mask defect repairing method according to the first embodiment of the present invention.

(b) As a result, a thin chromium film 9a remains where the microscopic defect 6a was present. The judgment over the end of the etching is delayed more in an edge region of the microscopic defect 6a adjacent to the pattern of the light-shielding line 3b than in a central region of the microscopic defect 6a, because some of the chromium ions in the light-shielding line 3b close to the microscopic defect 6a may be detected at the same time. This allows the etching action to be continued in the adjacent edge region of the microscopic defect 6a while it is terminated in the central region. Accordingly, the adjacent edge region of the microscopic defect 6a can be etched until the upper surface of the quartz substrate 2 appears, leaving no sign of the chromium film. On the other hand, the number of chromium ions is more quickly reduced in an edge region opposite to the adjacent edge region of the microscopic defect 6a than in the central region. Hence, the opposite edge region will remain thicker, giving an uneven profile of the thickness of the microscopic defect 6a. That is, an uneven thin chromium film 9a is left after the gas assisted FIB etching of the microscopic defect 6a, as shown in FIG. 6B. More typically, the perimeter of the thin chromium film 9a of the microscopic defect 6a ranges from 15 nm to 30 nm. The thickness of the central region of the microscopic defect 6a after the gas assisted FIB etching is smaller than 30 nm, for example, substantially 0.3 nm to 5 nm. As shown in FIG. 6B, the light-shielding line 3b has an oblique sidewall at the left edge, differing from that of the remaining vertical sidewall of the light-shielding lines 3a and 3c. The oblique sidewall corresponds to the repaired portion, and is easily recognized, since the oblique sidewall is brighter than other vertical edges in reflective images. Although it may depend on the etching condition of after the gas assisted FIB etching, the oblique angle of the sidewall at the repaired portion may be less than 10 degrees from the normal direction (or the perpendicular direction) of the mask substrate. The light-shielding line 3b has the vertical sidewall at the right edge, obviously. By the existence of the bright oblique sidewall at the repaired portion, the left edge of the light-shielding line 3b may show a small bite in a plan view, but the bite is so small that the left edge of the light-shielding line 3b can be regarded as a straight line in a practical sense of photolithography. Actually, the bright oblique sidewall at the repaired portion cannot easily be recognized in transmission images.

Figure 6C:
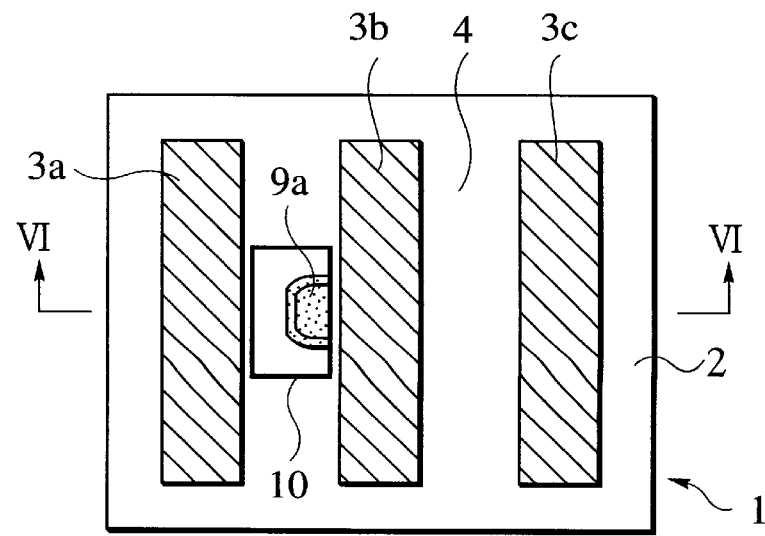
FIG. 6C is a plan view of the chromium mask explaining the mask defect repairing method according to the first embodiment of the present invention.

(c) Then, as shown in FIG. 6C, a laser irradiation area 10 is determined for removing the thin chromium film 9a by exposure to laser. No thin chromium film 9a remains in the adjacent edge region of the microscopic defect 6a as shown in FIG. 6B, allowing the quartz substrate 2 to appear. Therefore, the exposure to laser is not needed in the adjacent edge region of the microscopic defect 6a. The laser irradiation area 10 is so sized as not to overlap the pattern of the chromium light-shielding line 3b but to cover the thin chromium film 9a of the microscopic defect 6a as shown in FIG. 6C. As a laser beam is directed to the laser irradiation area 10 spaced by a given distance from the pattern of the chromium light-shielding line 3b, it falls on and etches the thin chromium film 9a of the microscopic defect part. Accordingly, the thin chromium film 9a is eliminated as shown in FIG. 6D. In the method of the first embodiment of the present invention, the laser irradiation area 10 is determined over the thin chromium film 9a of the microscopic defect 6a, which is spaced from the pattern of the film 3b, as shown in FIG. 6C, thus not requiring a higher level of the accuracy for focusing the beam of a laser mask defect repairing apparatus. Also, peeling, rat-bites, or edge-roughness on edge regions of the pattern of the chromium light-shielding line 3b caused by misalignment of the laser beam or the like may be avoided. As stated above, by the existence of the bright oblique sidewall at the repaired portion, the left edge of the light-shielding line 3b may show the microscopic bite in the plan view, but the bite is so small that the left edge of the light-shielding line 3b cannot be regarded as the rat-bites in a practical sense of photolithography. The thickness of the thin chromium film 9a is substantially 30 nm at maximum and much smaller than that of the chromium light-shielding lines 3a, 3b and 3c, which are typically 100 nm. Accordingly, damage to the mask caused by exposure to the repairing laser will be minimized as compared with a conventional method in which the microscopic defect is equal in thickness to the pattern light-shielding layer.

Figure 8A:
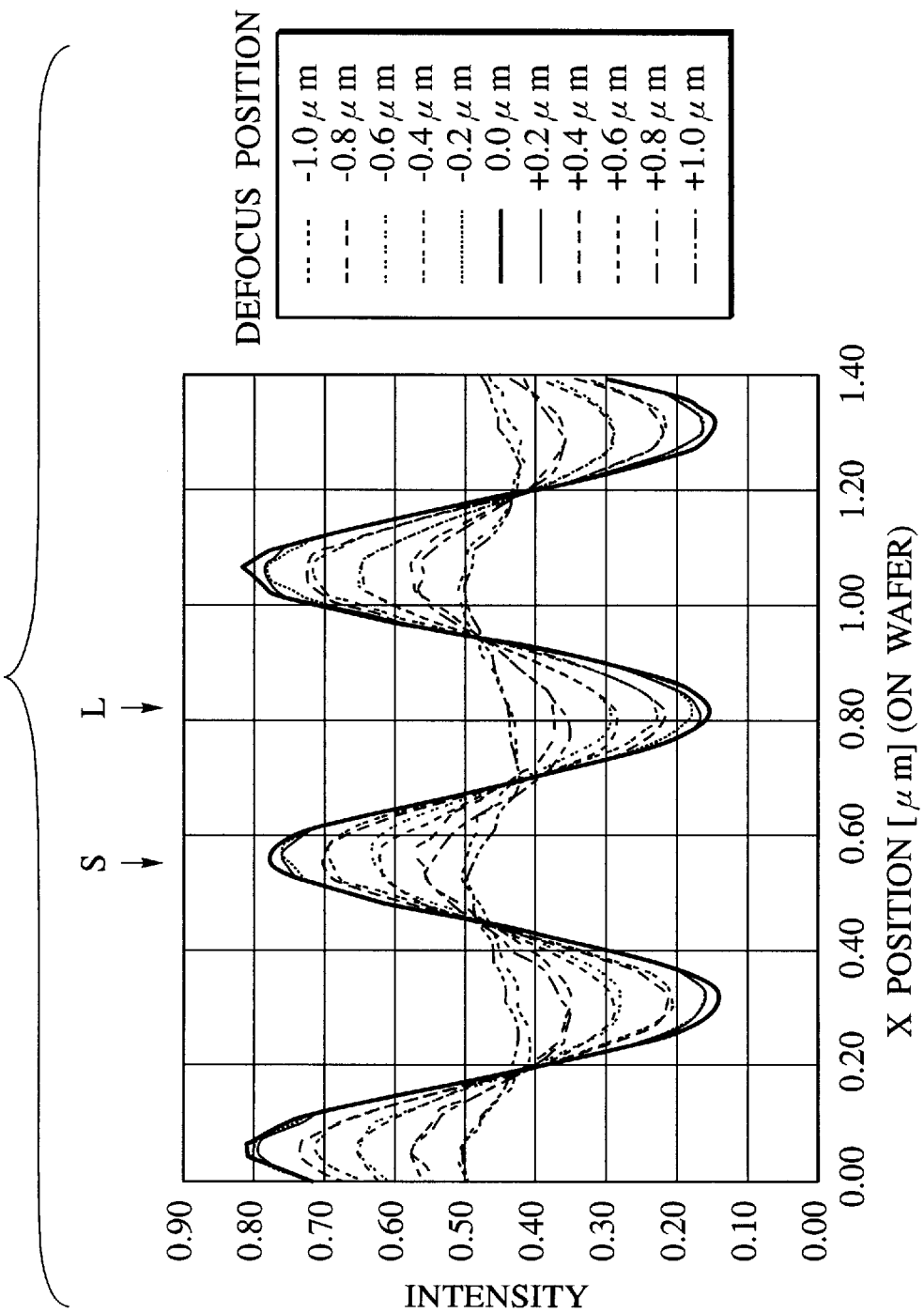
FIG. 8A is a diagram showing a profile of the image intensity on a wafer exposed to an image of the mask pattern repaired by the method of the first embodiment of the present invention.

FIG. 8A illustrates a profile of the image intensity on a wafer taken along the line VI–VI of FIG. 6D(a) when the laser of wavelength of 248 nm is focused through a mask pattern repaired by the method of the first embodiment of the present invention. The profile of the image intensity can be measured using an aerial image measurement system for various defocus positions of 0.0, ±0.2, ±0.4, ±0.8, and ±1.0 $\mu$m. Characteristic examples of the image measurement system applicable for the purpose include a Carl Zeiss Microlithography Simulation Microscope ("MSM-100"). The image measurement system has a CCD sensor disposed over a wafer for measuring the intensity of light passing through a reticle under the same exposure conditions as that of a stepper. The ordinate in FIG. 8A represents the image intensity and the abscissa represents the X position in micrometers ($\mu$m) on the wafer. The exposure conditions in the stepper are as follows:

| [070] | the exposure wavelength | $\lambda$ = 248 nm; |
|---|---|---|
| [071] | the aperture number | NA = 0.6; and |
| [072] | the coherence factor | $\gamma$ = 0.75. |

The position "S" in FIG. 8A corresponds to the space portion 14 (the repaired mask space shown in FIG. 6D) in the repaired mask, and it exhibits a decrease in the image intensity, not higher than 5% compared with that of the non-defect region, or the normal portion. The position "L" in FIG. 8A corresponds to the repaired mask line 3b shown in FIG. 6D.

Figure 8B:
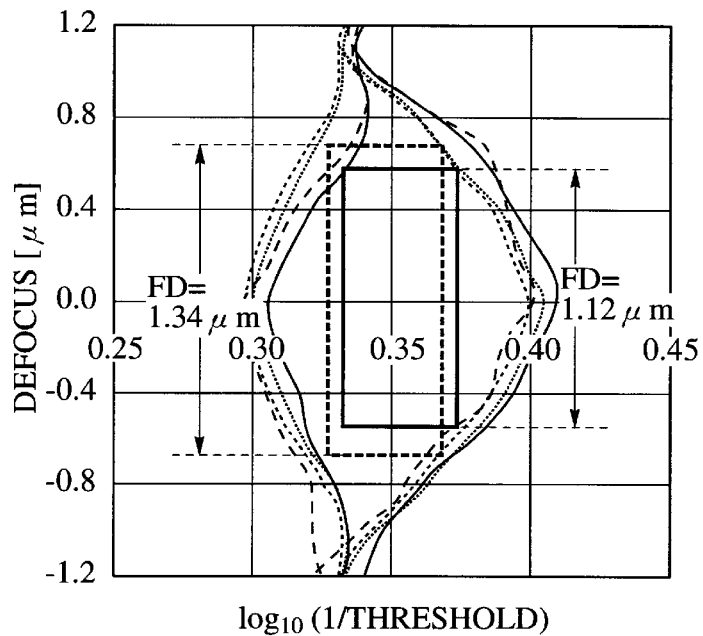
FIG. 8B is a diagram showing process windows at 10% of the exposure margin, calculated from the profile shown in FIG. 8A.

FIG. 8B shows the relationship between exposure intensities and defocusing distances obtained from the profile of the image intensity shown in FIG. 8A. The abscissa in FIG. 8B represents an inverse of the threshold relative to the exposure intensity obtained from FIG. 8A. More specifically, the threshold defines a ratio between the line and space, and the threshold becomes smaller as the exposure intensity increases as shown in FIG. 8A. The higher the inverse of the threshold, the more the exposure intensity increases. In fact, FIG. 8B illustrates the relationship between the exposure intensity of light and the defocusing point (distance) when the pattern consisting of the space portion 14 (the repaired mask space) and the light-shielding layer 3b (the repaired mask line) is focused at 0.25 $\mu$m ±10% on the wafer. Also, FIG. 8B shows process windows at 10% of the exposure margin defined by the relationship between the exposure intensity and the defocusing position. The focal depth (FD) is 1.34 $\mu$m when the exposure margin is 10% in the process window for the non-defect pattern while the FD=1.12 $\mu$m in a common process window for the repaired mask pattern and the non-defect pattern (at 10% of the exposure margin). It is thus apparent that the repaired mask pattern becomes 80% or more of the non-defect pattern in the FD.

The method for repairing a pattern defect according to the present invention is not limited to the line and space pattern, the mask magnification (or reduction system), and the type and size of defect described with the first embodiment, but may successfully be applicable to any repairing of defects on a mask when the pattern film material is selected from chromium materials. As set forth above, the method for repairing a pattern defect according to the first embodiment of the present invention is applicable to any defect on a chromium mask to be eliminated at higher precision and geometrical accuracy, without damaging the mask substrate. As a result, a change in the intensity of a resultant pattern image caused by the repaired region of the mask will be minimized and a favorable level of the wafer-processing margin will be gained.

SECOND EMBODIMENT

A second embodiment of the present invention will be described in the form of a mask defect repairing method of eliminating a microscopic defect 6a generated on a phase shifter 17b made of an oxide nitride of molybdenum silicide (MoSiO$_x$N$_y$) as a pattern film material delineated on a quartz substrate 2. Instead of MoSiO$_x$N$_y$, an oxide of molybdenum silicide (MoSiO$_x$), or composite film of MoSiO$_x$N$_y$/MoSi and MoSiO$_x$/MoSi can also be employed for the phase shifter 17b. The molybdenum silicide phase shifter 17b is referred to as "the phase shifter 17b" hereinafter. And a molybdenum silicide phase shifter pattern may be called as "a phase shifter pattern".

Figure 9:
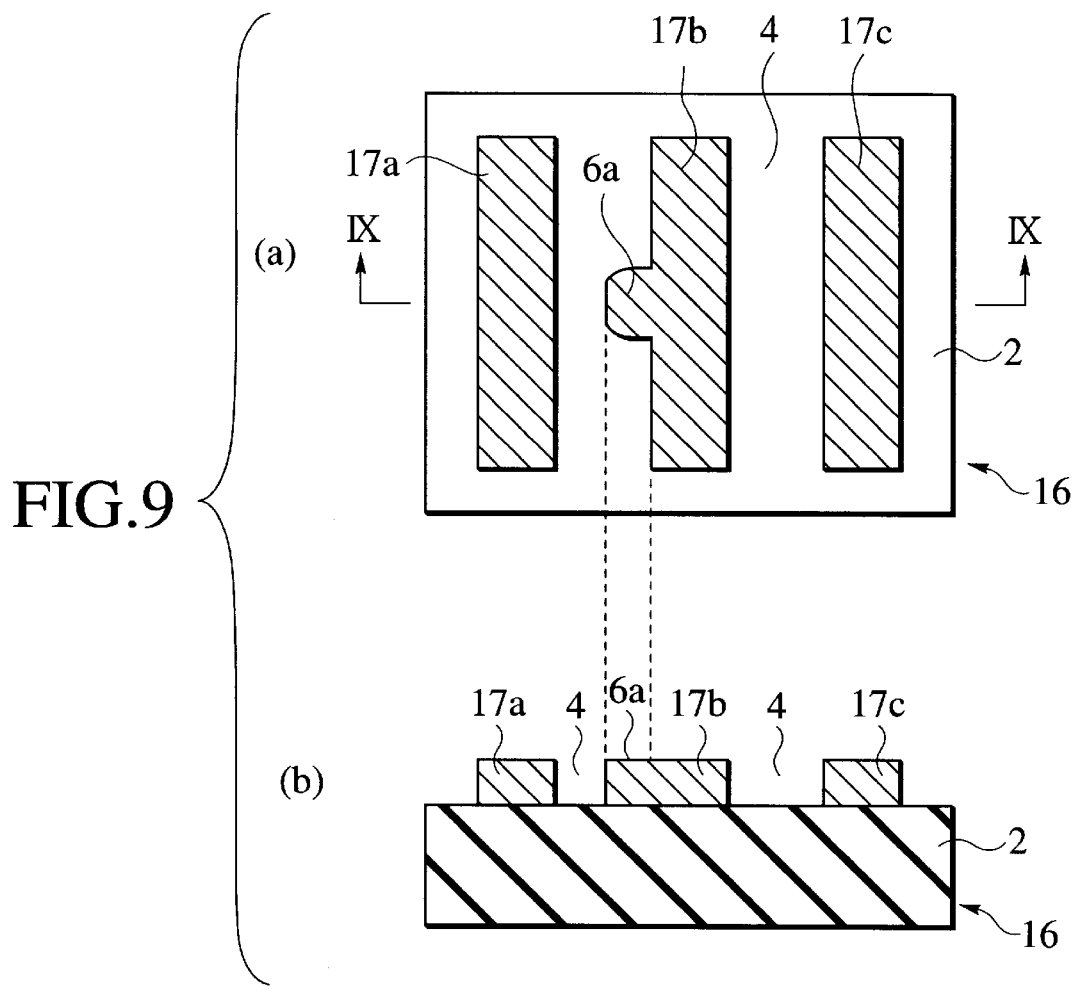
FIG. 9 illustrates a plan view (a) and a cross sectional view (b) taken along the line IX—IX of the plan view (a), showing a phase shift mask having a microscopic defect which is to be repaired according to the present invention.

A phase shift mask 16 shown in FIG. 9 comprises the line pattern of phase shifter 17b made of the oxide nitride of molybdenum silicide and another line patterns 17a and 17c delineated on the transparent quartz substrate 2. The line patterns 17a and 17c can be made of the oxide nitride of molybdenum silicide. The mask pattern includes the space pattern 4 sandwiched between lines 17a and 17b, and the space pattern 4 sandwiched between lines 17b and 17c. It is assumed that the microscopic defect 6a extends from the left edge of the line pattern 17b as shown in FIG. 9.

Figure 10A:
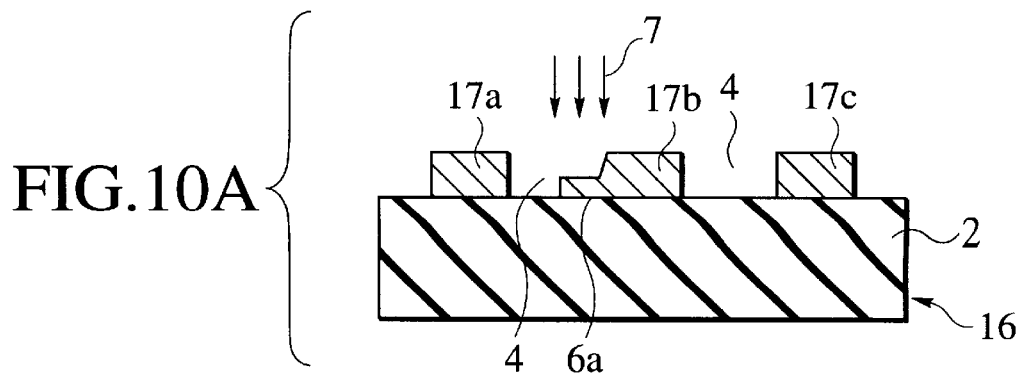
FIG. 10A is a cross sectional view of the phase shift mask explaining a mask defect repairing method according to a second embodiment of the present invention.

(a) First, as shown in FIG. 10A, the microscopic defect 6a is etched by sputtering. At FIB 7, gallium ions with an accelerating voltage of 20 kV, a current of 50±10 pA, and a beam diameter of 0.2 $\mu$m $\phi$ are employed. Considering that there may possibly be created riverbeds around the perimeter of the microscopic defect 6a, the exposure area for the FIB directed towards the transparent quartz substrate 2 is narrowed by 0.3 nm to 200 nm from the edge of the microscopic defect 6a. That is, the exposure area is inwardly shrunk by 0.3 nm to 200 nm from the far side edge of the microscopic defect 6a, except for the edge next to the line 17b. Preferably, it is inwardly shrunk by a half of the beam diameter of the FIB. For example, the exposure area is inwardly narrowed by 100 nm, corresponding to a half of the beam diameter from the edge of the microscopic defect 6a. Also, the etching is controlled to have a thin layer of the molybdenum silicide film remained not higher than 30 nm of the thickness of the microscopic defect 6a in order to prevent the quartz substrate 2 beneath the microscopic defect 6a from being exposed completely. As a result, a gallium doped molybdenum silicide layer 18 derived from the microscopic defect 6a is left.

Figure 10B:
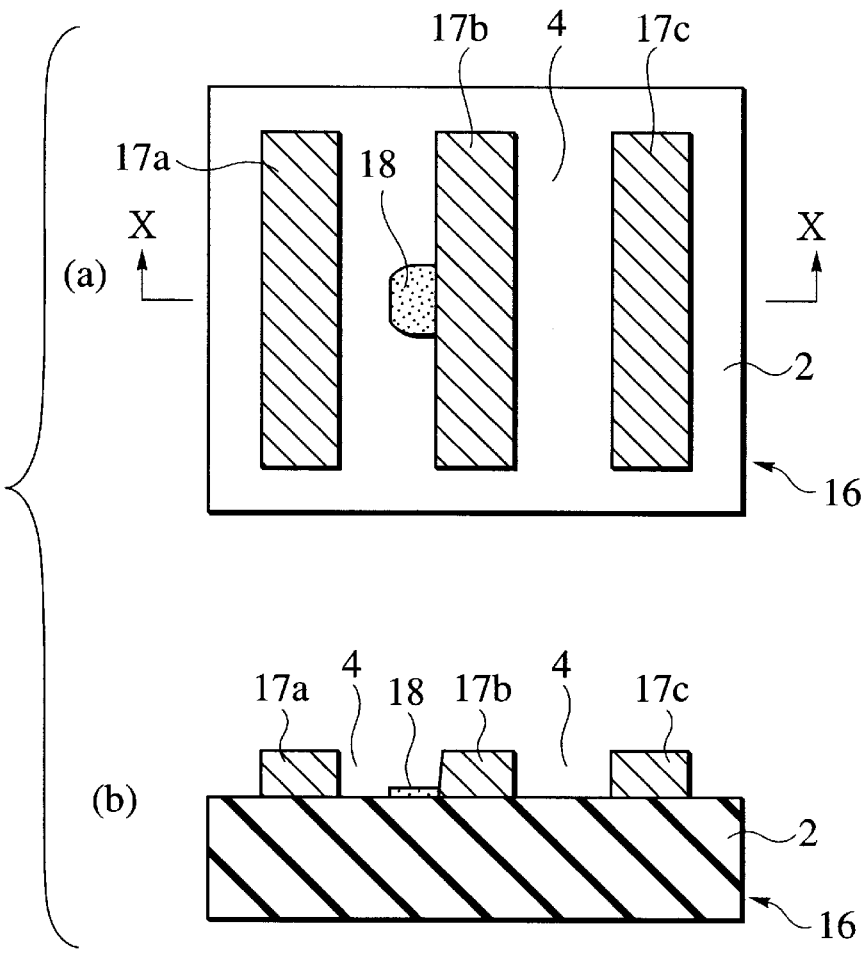
FIG. 10B illustrates a plan view (a) and a cross sectional view (b) taken along the line X—X of the plan view (a), explaining the mask defect repairing method according to the second embodiment of the present invention.
Figure 10C:
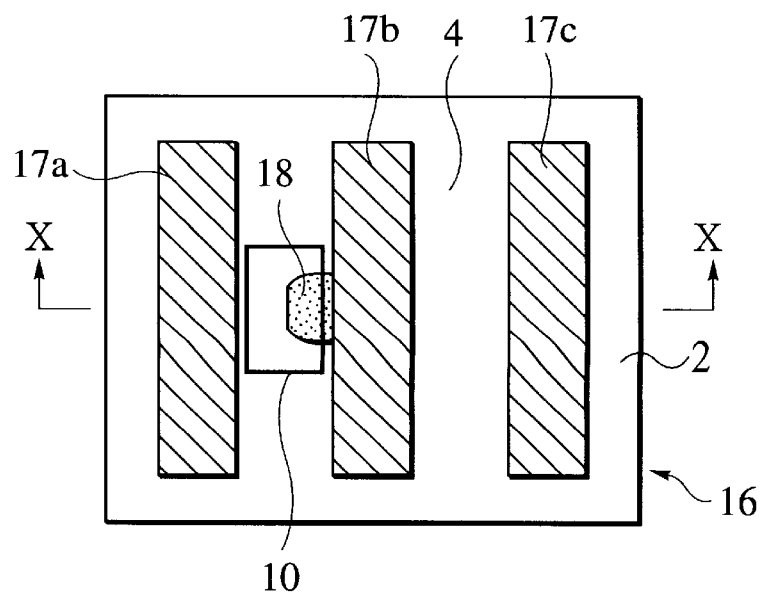
FIG. 10C is a plan view of a mask pattern showing still another example of pattern defect formed on the mask substrate.

(b) Then, as shown in FIG. 10C, the irradiation area 10 of a laser beam is determined not to overlap the pattern edge of the phase shifter 17b. The laser beam is directed to the laser irradiation area 10 to remove the gallium doped molybdenum silicide layer 18. The gallium doped molybdenum silicide layer 18 contains gallium ions implanted by the FIB and enables the absorption of more energy of the laser beam, thus the layer is eliminated with higher efficiency. This permits the gallium doped molybdenum silicide layer 18 to be eliminated without controlling the irradiation area of the laser beam to run directly beside (and along) the edge of the pattern. After this step, the repaired mask pattern is obtained as shown in FIG. 10D.

The method for repairing pattern defect according to the present invention is not limited to the mask pattern, the mask magnification, the type and size of defect, and the pattern film material described with the second embodiment, but may successfully be applicable to any repairing of a microscopic defect on a mask.

As set forth above, the second embodiment of the method for repairing a pattern defect according to the present invention allows any microscopic defect on a molybdenum silicide phase shift mask to be eliminated at higher precision and processing facilitation without damaging the mask substrate. As a result, a change in the intensity of a resultant pattern image caused by a repaired region of the mask will be minimized and a favorable level of the wafer-processing margin will be gained.

While the etching of a microscopic defect by the FIB sputtering of the second embodiment produces a gallium doped molybdenum suicide layer, a modification of the second embodiment of the present invention is described, wherein a microscopic defect of the oxide nitride film has completely been removed, and a region of the quartz substrate from which the microscopic defect is eliminated develops a thin surface layer of gallium-doped quartz.

A phase shift mask 16 repaired by the modification of the second embodiment of the present invention is composed of a group of molybdenum silicide phase shift patterns 17a, 17b and 17c with a microscopic defect developed on a quartz substrate 2 and a space portion 4 defined between the patterns 17a, 17b and 17c.

(a) First, as shown in FIG. 11A, the microscopic defect of an oxide nitride film of molybdenum silicide is completely removed by FIB sputtering, leaving a thin gallium doped quartz layer 19 in the quartz substrate 2.

(b) Then, as shown in FIG. 11B, the gallium doped quartz layer 19 is eliminated by a gas assisted FIB etching process using a xenon difluoride (XeF$_2$) 20 and a FIB 7. As the gallium doped quartz layer 19 is removed by the etching, a recess 21 is formed in the quartz substrate 2 beneath the repaired region from which the gallium doped quartz layer 19 is eliminated, as shown in FIG. 11C. The recess 21 can be so shallow as to give no interruption in an image of the pattern projected on a wafer.

Figure 12A:
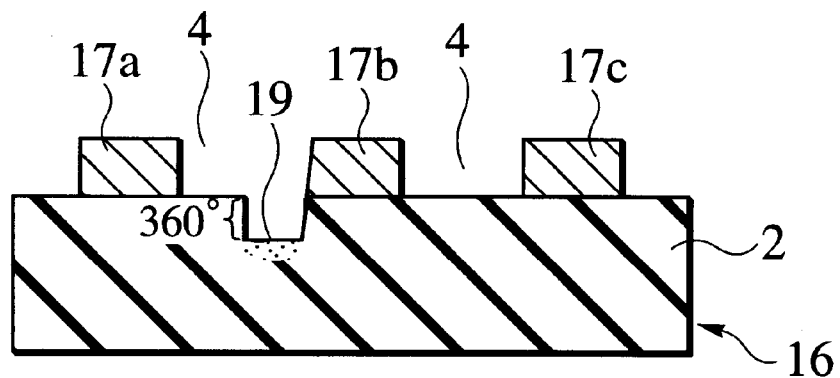
FIG. 12A is a cross sectional view of the phase shift mask explaining a modification of the mask defect repairing method according to the modification of the second embodiment of the present invention.
Figure 12B:
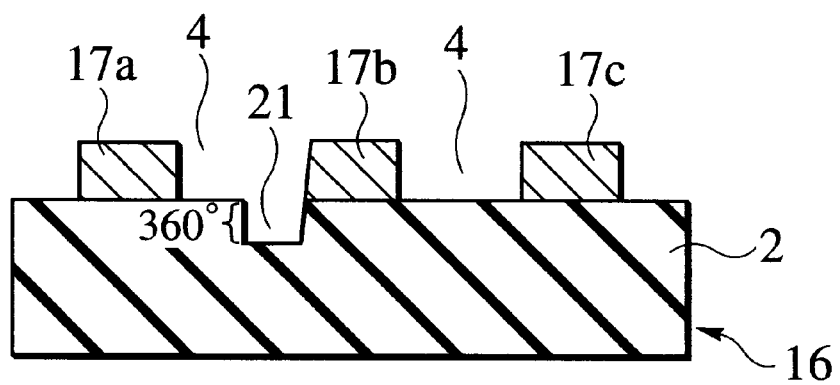
FIG. 12B is a cross sectional view of the phase shift mask explaining the modified mask defect repairing method according to the modification of the second embodiment of the present invention.

As shown in FIG. 12B, when the phase at the recess 21 to be repaired is shifted 360 degrees from the phase at the non-defect surface of the quartz substrate, no phase difference occurs in the pattern defect repairing.

Although the laser etching or the gas assisted FIB etching with the xenon difluoride 20 is used for removing the gallium doped molybdenum silicide layer 18 (See FIG. 10B(a)) or the gallium doped quartz layer 19 (See FIG. 11A(a)), other appropriate processes may equally be applied such as alkali wet etching using a solution of potassium hydroxide (KOH) or sodium hydroxide (NaOH) for eliminating gallium and dry etching by selective plasma etching of a gallium container layer.

THIRD EMBODIMENT

Third embodiment of the present invention pertains a method of mask repairing a microscopic defect 6a generated on a phase shift mask 22. The phase shift mask 22 of the third embodiment is composed of chromium/molybdenum silicide patterns 23a, 23b and 23c formed on a transparent quartz substrate 2. Each of the chromium/molybdenum silicide patterns 23a, 23b and 23c consists of the corresponding phase shift pattern 17a, 17b or 17c made of an oxide nitride of molybdenum silicide and a chromium film 24a, 24b or 24c provided on the phase shift pattern 17a, 17b or 17c, respectively. That is, the chromium films 24a, 24b and 24c are multi-layers, or composite films, comprising chromium layers and chromium oxide layers developed on the chromium layers, respectively.

In the boundary between shots, the lights penetrating the phase shift films overlap, when the mask pattern is projected on the wafer, so that the resist film formed on the wafer is unintentionally exposed. It is necessary to shield the perimeter of the mask to prevent this, namely the part disposed at the boundary between shots on the wafer must be covered. Generally, the chromium film, which sufficiently shields the light in this region, is employed for this purpose. This is called "the chromium frame." Next the general manufacturing process of the molybdenum silicide phase shift mask with the chromium frame will be shown.

Figure 13A:
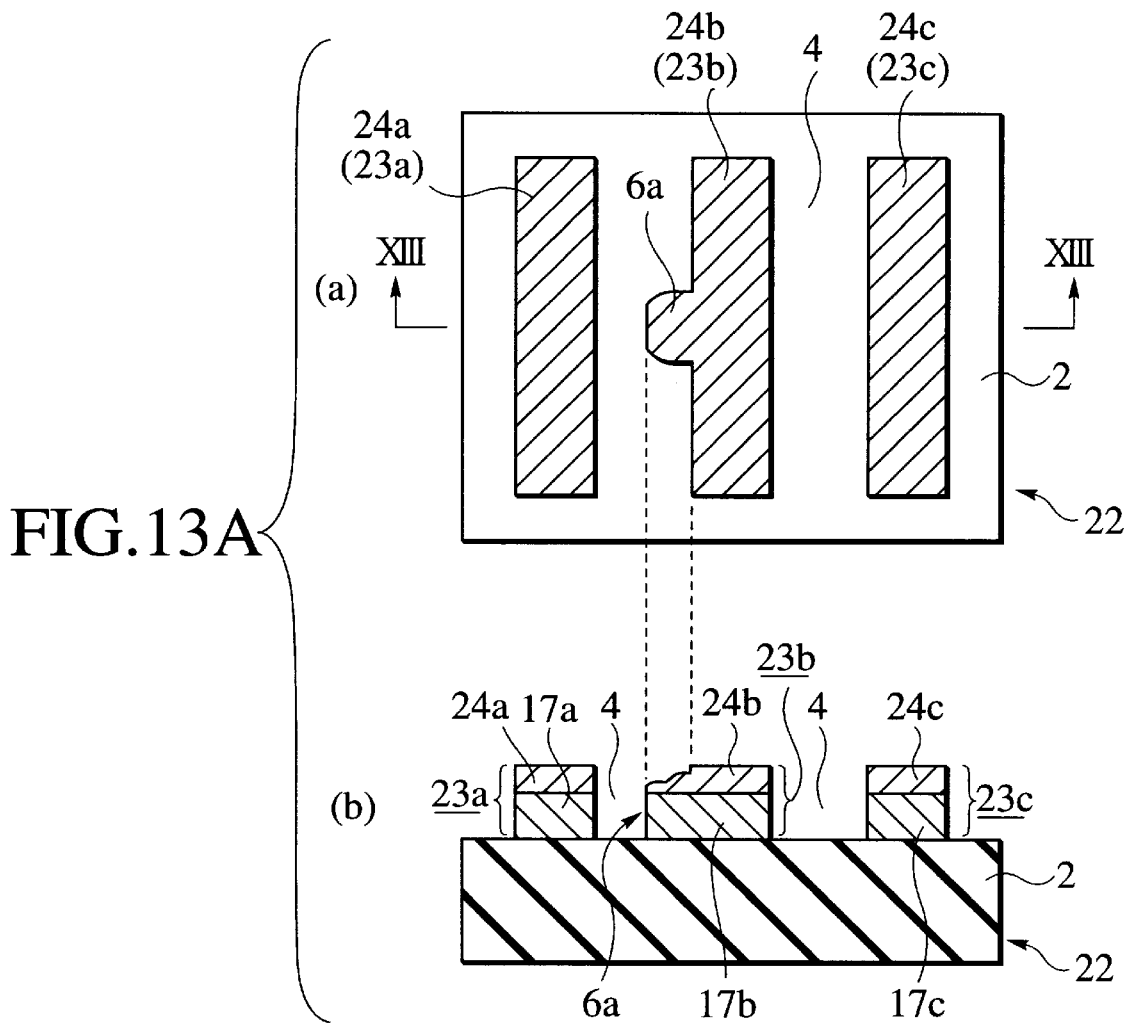
FIG. 13A illustrates a plan view (a) and a cross sectional view (b) taken along the line XIII—XIII of the plan view (a), explaining the mask defect repairing method according to the third embodiment of the present invention.

(a) First, a composite layer, comprising a molybdenum silicide phase shifter film and a chromium film developed on the phase shifter film, is deposited on the quartz substrate 2. Then, a resist film is coated on the surface of the mask material. And the resist film is delineated to a desired pattern by exposing the resist film with an electron beam emitted from an electron beam lithography system. Using the pattern of the resist film as an etching mask, both the chromium film and the molybdenum silicide phase shifter film are etched, e.g. by reactive ion etching (RIE), to form patterns of the molybdenum silicide phase shifter films 17a, 17b and 17c. Then, the resist film of the etching mask is removed. In addition, another resist film is coated on the chromium film, and the image of chromium frame is drawn on the resist film. Thereafter, the chromium etching is carried out again to remove the chromium films except for the chromium frame region, using the resist film mask to delineate the chromium frame. Then, the resist film is removed, and the molybdenum silicide phase shift mask with the chromium frame is completed. In the fourth embodiment of the present invention, the defect inspection is carried out, before the above process of chromium frame delineation. That is, the repairing of the defect is executed before the chromium film on the molybdenum silicide film, except for the chromium frame region, is removed. Referring to FIG. 13A, the chromium films 24a, 24b and 24c are not removed but remain on the molybdenum silicide phase shifter films 17a, 17b and 17c, respectively. The mask pattern comprises line patterns of the chromium/molybdenum silicide patterns 23a, 23b and 23c having the chromium films 24a, 24b and 24c disposed on the phase shifter films 17a, 17b and 17c. A space pattern 4 is sandwiched between the chromium/molybdenum silicide patterns 23a and 23b. Further, another space pattern 4 is sandwiched between the chromium Imolybdenum silicide patterns 23b and 23c. It is now assumed that the microscopic defect 6a extends from the left edge of the line pattern 23b.

Figure 13B:
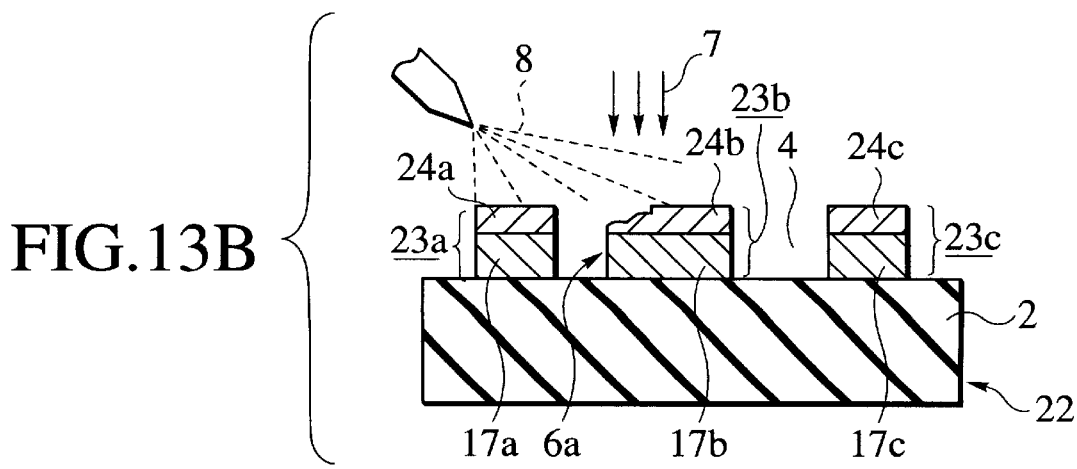
FIG. 13B is a cross sectional view of the phase shift mask explaining the mask defect repairing method according to the third embodiment of the present invention.

(b) As shown in FIG. 13B, the chromium film 24b of the microscopic defect 6a is etched by a gas assisted FIB etching process with the etching gas 8 being supplied. At FIB 7, gallium ions accelerated by voltage of 20 kV, having a current of 50±10 pA and a beam diameter of 0.2 $\mu$m$\phi$, are employed. In the third embodiment of the present invention, since the chromium films 24a, 24b and 24c are located on the molybdenum silicide phase shifter films 17a, 17b and 17c, the pattern films are hardly charged up at the step of imaging with the FIB 7. This improves the S/N ratio between the chromium/molybdenum silicide patterns 23a, 23b and 23c and the space portions 4 and 4, thus enhancing the quality of a projected image and providing a stable accuracy of pattern defect repairing. Even if the microscopic defect 6a has an undulated surface, the end point of etching process of the gas assisted FIB etching can be monitored to finish at the surface of the defect or mask repaired region with a substantially flat configuration. More particularly, the end point of the etching process is detected by counting the number of chromium ions with a secondary ion detector when the surface of the repaired region becomes substantially flat. In detail, as stated in the first embodiment, a thin chromium film 9a is remaining where the microscopic defect 6a was present as shown in FIG. 13C (a). As explained in the first embodiment, the judgment over the end of the etching is more delayed at the perimeter of the microscopic defect 6a than in a central region of the microscopic defect 6a. That is, the detected number of chromium ions is more quickly reduced in the perimeter opposite to the adjacent edge region of the microscopic defect 6a than in the central region. Hence, the opposite edge region will remain thicker, forming the uneven thin chromium film 9a, after the gas assisted FIB etching of the microscopic defect 6a, as shown in FIG. 13C. More typically, the perimeter of the thin chromium film 9a of the microscopic defect 6a ranges from 15 nm to 30 nm. The thickness of the central region of the microscopic defect 6a after the gas assisted FIB etching is smaller than 30 nm, for example, substantially 0.3 nm to 5 nm.

Figure 13E:
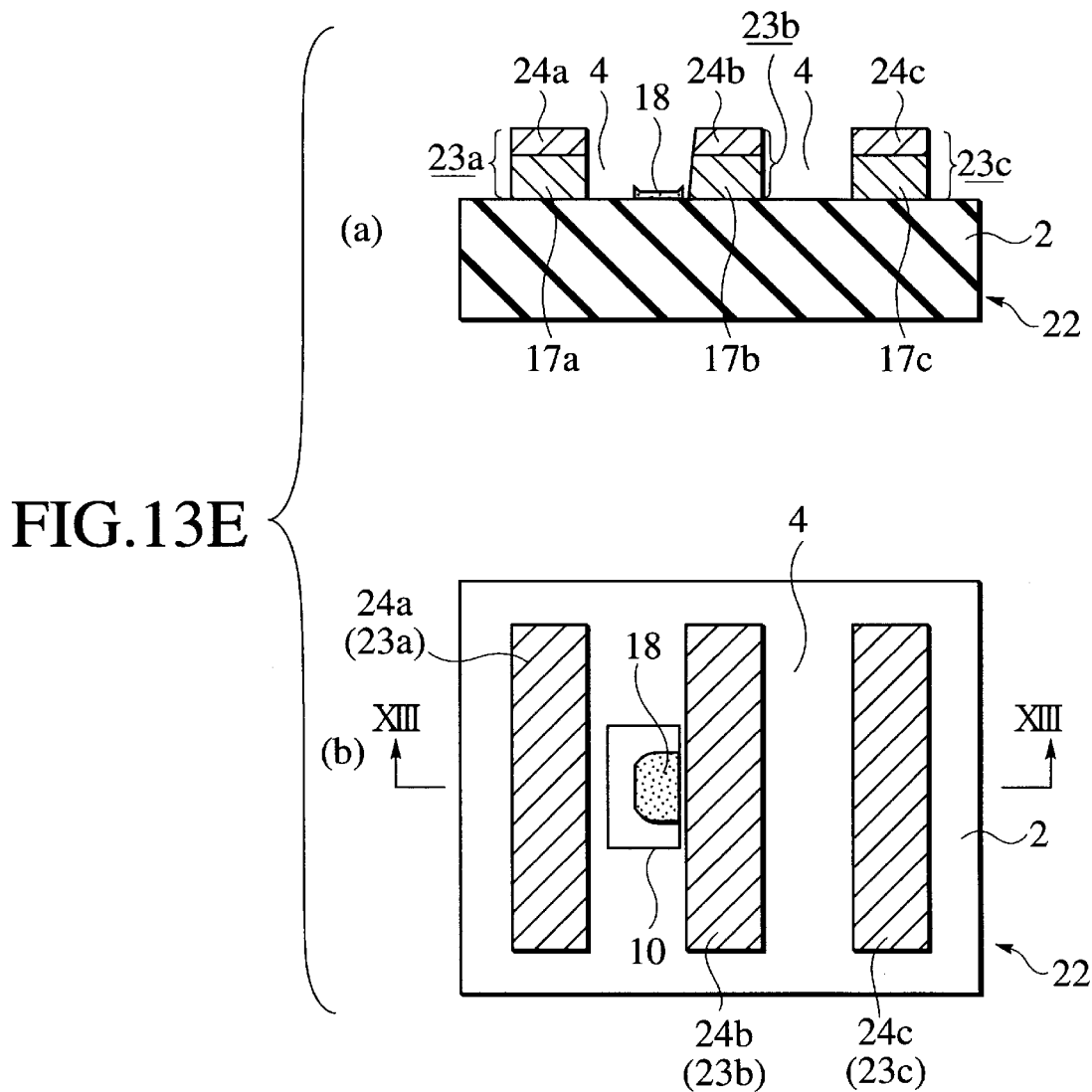
FIG. 13E illustrates a plan view (b) and a cross sectional view (a) taken along the line XIII—XIII of the plan view (b), explaining the mask defect repairing method according to the third embodiment of the present invention.

(c) Then, as shown in FIG. 13D, the remaining chromium film 9a and the molybdenum silicide phase shifter film 17b of the defect 6a is etched by repeating the same gas assisted FIB etching process. The etching of the molybdenum silicide film may be carried out by an FIB sputtering process, stopping the supply of the etching gas. However, when the supply of the etching gas is changed, the irradiation area of the FIB may be shifted, deteriorating the etching performance so that high accuracy cannot be established. The positional shift of nozzles for supplying the etching gases may change the electric field distributions, hence changing the location of the beam. Accordingly, the third embodiment of the present invention preferably employs the gas assisted FIB etching process with same etching gas for both the chromium films 24a, 24b and 24c and the phase shift films 17a, 17b and 17c. The gas assisted FIB etching may form riverbeds around the perimeter of the microscopic defect 6a as explained previously. For compensation, the irradiation area of the ion beam directed towards the microscopic defect 6a on the transparent quartz substrate 2 is inwardly narrowed by 0.3 nm to 200 nm from the edge of the microscopic defect 6a. Preferably, it is narrowed by half of the beam diameter of the FIB. Considering the beam diameter of the FIB, the area is inwardly narrowed, for example, by 100 nm from the edge of the microscopic defect 6a. Also, the microscopic defect 6a is etched to leave a thin layer of the molybdenum silicide that is not higher than 30 nm in thickness so that the quartz substrate under the microscopic defect 6a is prevented from being completely exposed to the FIB. As a result, a gallium doped molybdenum silicide layer 18 remains where the microscopic defect 6a was present as shown in FIG. 13E.

Figure 13F:
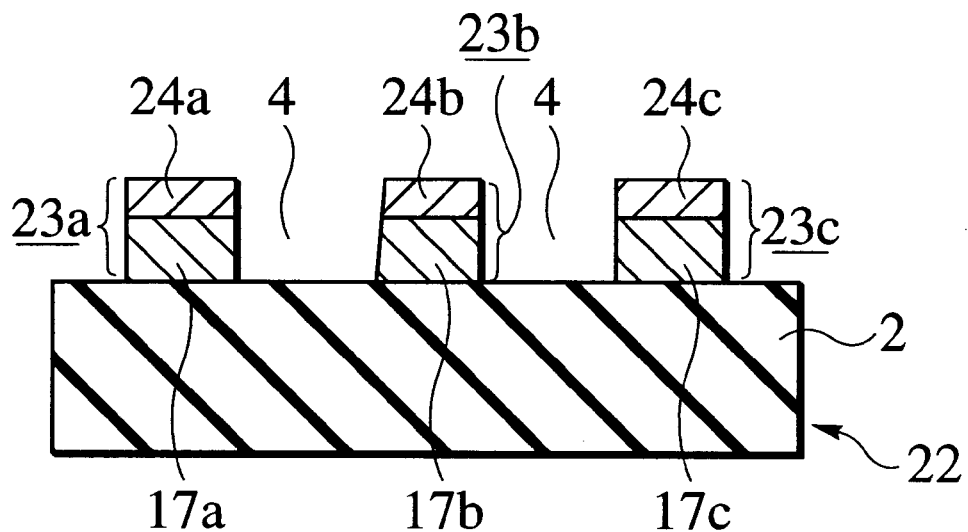
FIG. 13F is a cross sectional view of the phase shift mask explaining the mask defect repairing method according to the third embodiment of the present invention.

(d) Then the gallium doped molybdenum silicide layer 18 derived from the microscopic defect 6a is removed by exposure to a laser beam. The molybdenum silicide layer 18 of the microscopic defect 6a contains gallium ions implanted by the FIB and enables absorption of more energy from the laser beam thus being eliminated at a higher efficiency. Accordingly, even when the irradiation area 10 of the laser beam is determined not to overlap the molybdenum silicide phase shifter film 17b as shown in FIG. 13E, the gallium doped molybdenum silicide layer 18 adjacent to the edge of the molybdenum silicide phase shifter film 17b can be eliminated without difficulty. Consequently, as shown in FIG. 13F, the mask pattern can be repaired to a desired definite shape, after the gallium doped molybdenum silicide layer 18 of the microscopic defect 6a having been eliminated completely. Similar to the second embodiment, this step may be carried out by completely removing the molybdenum silicide of the microscopic defect 6a so as to form the gallium doped quartz layer in the quartz substrate 2, and eliminating the gallium doped quartz layer with a xenon difluoride gas assisted FIB etching process (See FIG. 11B). As the mask repaired by the method of the third embodiment of the present invention has the chromium film 24b disposed on the molybdenum silicide phase shifter film 17b, the molybdenum silicide phase shifter film 17b, which is easily etched by the xenon difluoride gas 20, can be protected by the chromium film 24b. Also, the removal of the gallium doped molybdenum silicide layer or the gallium doped quartz layer may be conducted successfully by any other appropriate process such as alkali wet etching using a solution of potassium hydroxide (KOH) or sodium hydroxide (NaOH) for dissolving gallium. Further, the gallium doped molybdenum silicide layer or the gallium doped quartz layer may be removed by dry etching, such as by selective plasma etching, as well as by the laser etching and the xenon difluoride gas assisted FIB etching.

Figure 13G:
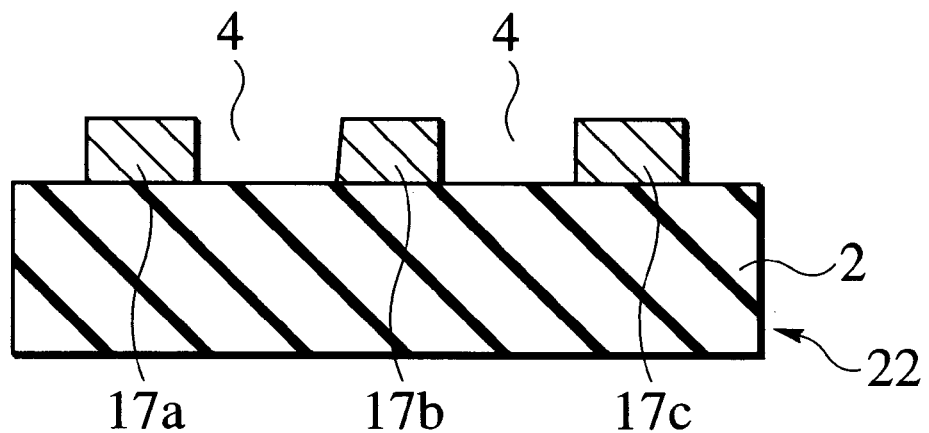
FIG. 13G is a cross sectional view of the phase shift mask explaining the mask defect repairing method according to the third embodiment of the present invention.

(e) Finally, as shown in FIG. 13G, the chromium films 24a, 24b and 24c on the molybdenum silicide phase shifter film 17a, 17b and 17c are peeled off and then, the method for repairing pattern defect according to the third embodiment of the present invention is ended. As shown in FIG. 13G, the phase shifter film 17b has an oblique sidewall at left edge, differing from that of the remaining vertical sidewall of the phase shifter films 17a and 17c. The oblique sidewall corresponds to the repaired portion, and can easily be recognized, since the oblique sidewall is brighter than other vertical edges in reflective images. Although it may depend on the etching condition of after the gas assisted FIB etching, the oblique angle of the sidewall at the repaired portion may be less than 10 degrees from the normal direction of the mask substrate. The phase shifter film 17b has the vertical sidewall at the right edge, obviously. By the existence of the bright oblique sidewall at the repaired portion, the left edge of the phase shifter film 17b may show a small bite in a plan view, but the bite is so small that the left edge of the phase shifter film 17b can be regarded as a straight line in a practical sense of photolithography. As set forth above, the pattern defect repairing method of the third embodiment of the present invention allows any defect on a phase shift mask having a chromium film provided on a phase shifter film of a molybdenum silicide to be successfully eliminated while maintaining the edge at higher precision, minimizing damage to the etched region, or suppressing the recess formation on the surface of the quartz substrate, and making the surface of a repaired region flat.

FOURTH EMBODIMENT

Figure 1C:
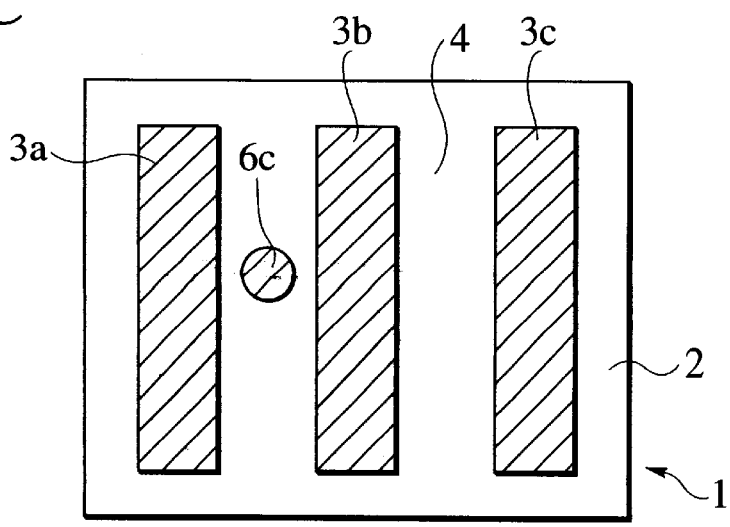
Figure 2A:
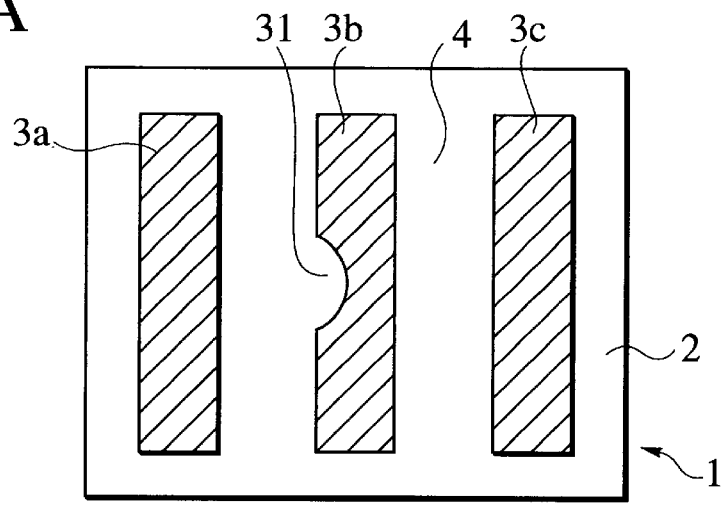
FIG. 2A is a plan view of a mask pattern, explaining a conventional method for repairing a mask defect, in which "a rat-bite" is formed at the pattern edge.
Figure 2B:
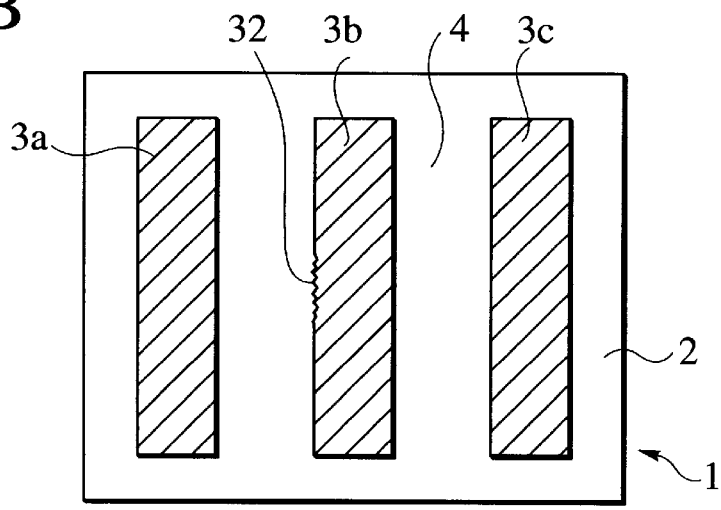
FIG. 2B is a plan view of a mask pattern, explaining a conventional method for repairing a mask defect, in which "edge-roughness" is formed at the pattern edge.
Figure 3:
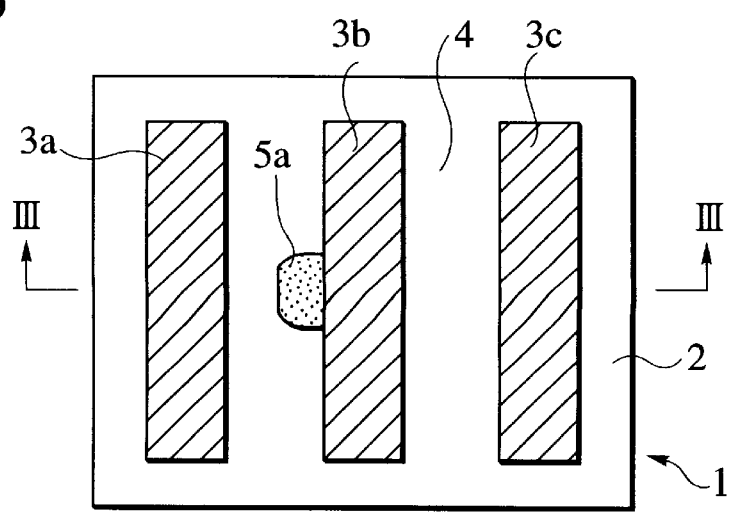
FIG. 3 is a plan view of a mask pattern explaining a conventional method for repairing a mask defect.
Figure 4:
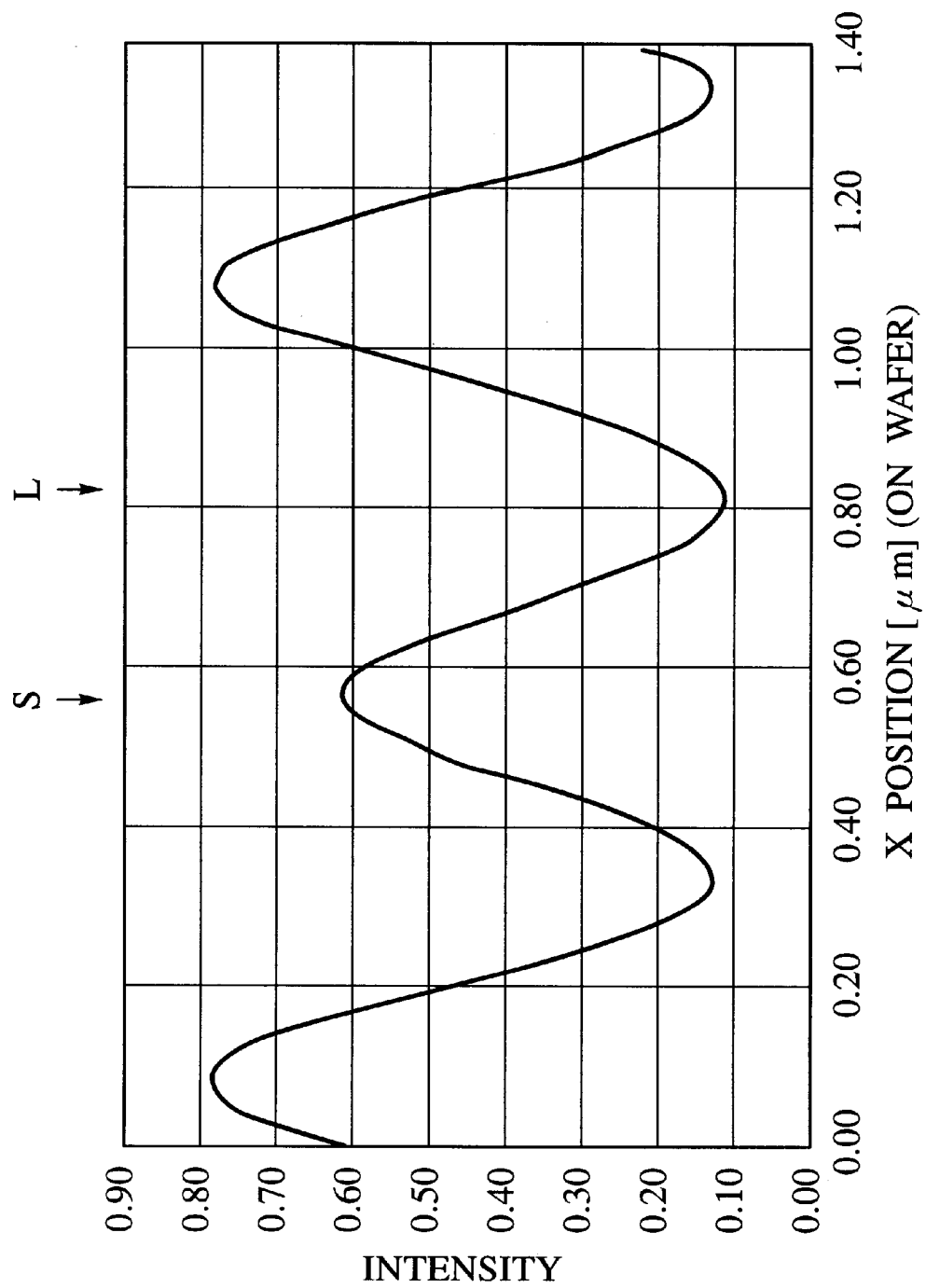
FIG. 4 is a diagram showing a profile of image intensity taken along the line III—III of FIG. 3.

The present invention is applicable to the isolated defect 6c disposed midway between lines 3a and 3b as shown in FIG. 1C. When the microscopic defect 6c is sputtered by a FIB with an assistant gas for chromium film etching so that the etching is finished when the number of chromium ions is decreased 70 to 80% in the end point detection level, a thin chromium film 9b remains where the microscopic defect 6c was present, as shown in FIG. 14. The perimeter of the thin chromium film 9b ranges I nm to 30 nm in thickness. The thickness of the central region of the thin chromium film 9b is smaller than 30 nm, for example, substantially 0.3 nm to 5 nm. Then, substantially same as the first embodiment, the thin chromium film 9b is eliminated by the laser irradiation.

Figure 15A:
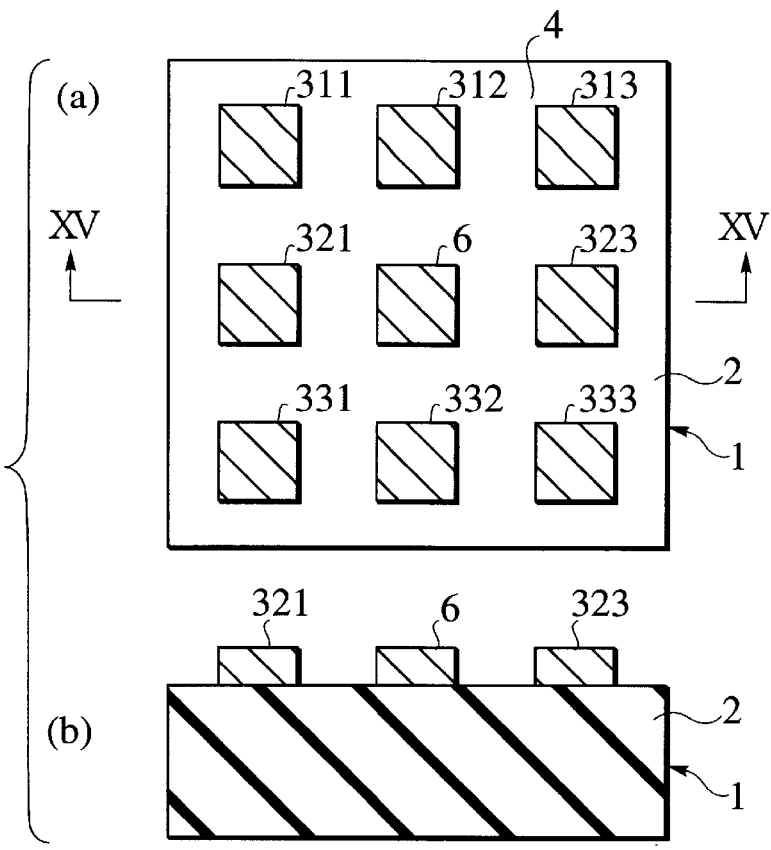
FIG. 15A illustrates a plan view (a) and a cross sectional view (b) taken along the line XV—XV of the plan view (a), showing a chromium mask having an isolated defect which is to be repaired according to the fourth embodiment of the present invention.

As shown in FIG. 15A, in a fourth embodiment of the present invention, eight chromium light-shielding squares 311, 312, 313, 321, 323, 331, 332, and 333 delineated on a transparent quartz substrate 2 are shown. Each of the chromium light-shielding lines squares 311, 312, 313, 321, 323, 331, 332, and 333 is composed of a layered structure consisting of a chromium layer and a chromium oxide layer provided on the chromium layer. The center of the chromium light-shielding lines squares 311, 312, 313, 321, 323, 331, 332, and 333, the isolated. The mask defect repairing method according to the fourth embodiment of the present invention will now be described.

(a) First, as substantially similar to the fist embodiment, the isolated defect 6 is sputtered by a gas assisted FIB etching process for chromium film etching. The assistant gas is sprayed over the mask surface. The exposure area about the isolated defect 6 to the ion beam, is inwardly narrowed by 0.3 nm to 200 nm from the edge of the isolated defect 6, preferably, it is narrowed by a half of the FIB diameter. The end point of the etching is determined by counting the number of chromium ions ill the etched region with a secondary ion detector. The etching proceeds to the point where the surface of the quartz substrate is nearly exposed, and stops, before the quartz substrate beneath the isolated defect 6 is completely exposed to the FIB.

Figure 15B:
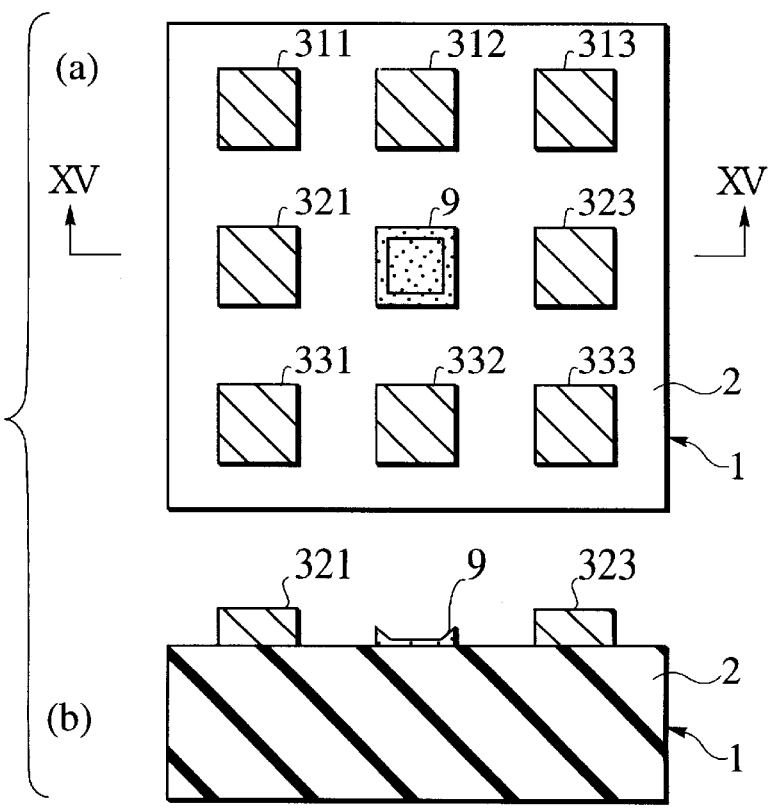
FIG. 15B illustrates a plan view (a) and a cross sectional view (b) taken along the line XV—XV of the plan view (a), explaining the mask defect repairing method according to the fourth embodiment of the present invention.
Figure 16:
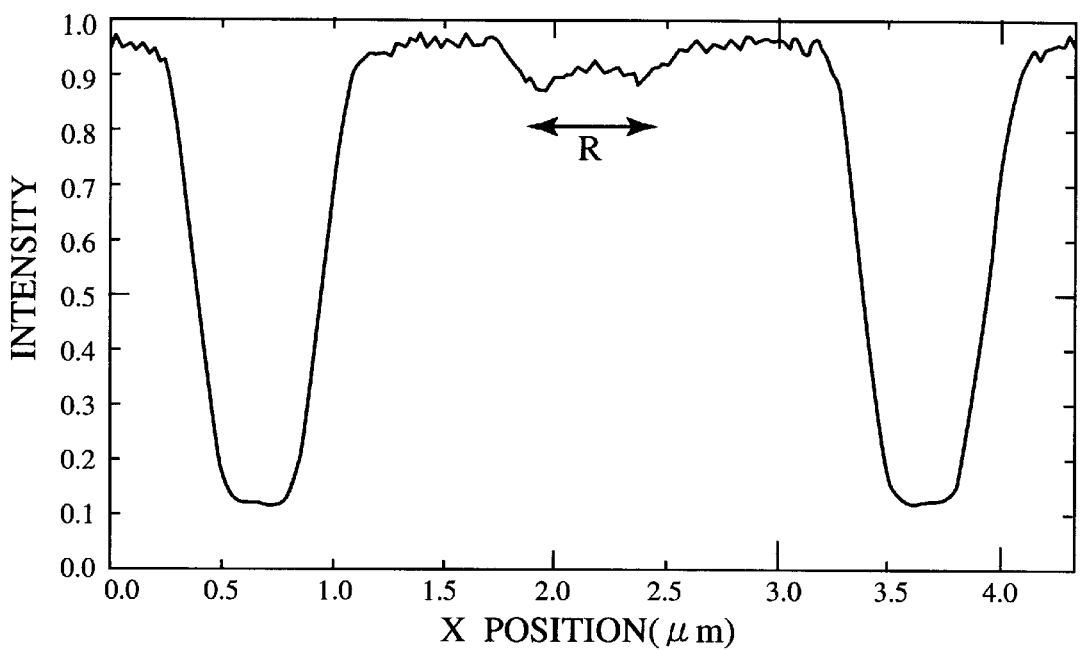
FIG. 16 illustrates an image intensity profile taken along line XV—XV of FIG. 15B.

(b) As a result, a non-uniform thin chromium film 9b remains where the isolated defect 6 was present. More typically, the thin chromium film 9b of the isolated defect 6 ranges from 15 nm to 30 nm at the perimeter. The thickness of the central region of the thin chromium film is smaller than 30 nm, for example, substantially 0.3 nm to 5 nm. FIG. 16 shows an image intensity profile taken along line XV—XV of FIG. 15B. There is 12% reduction of transmissivity at the perimeter of the isolated defect 6, and there is transmissivity reduction of about 8% on central portion of the isolated defect 6. In FIG. 16, "R" represents the repaired portion.

Figure 17:
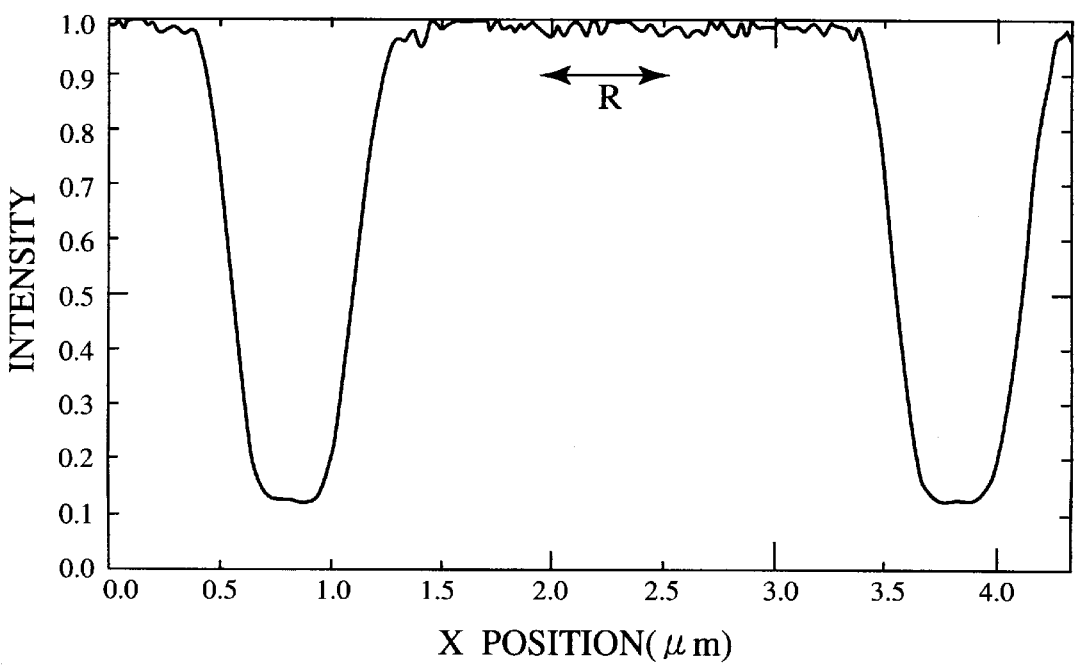
FIG. 17 illustrates an image intensity profile taken along line XV—XV of FIG. 15B, after the thin chromium film is etched away by acid solution.

(c) Next, the thin chromium film 9b is etched away by an acid solution. The repaired portion image intensity distribution after the thin chromium film 9b was removed is shown in FIG. 17. In FIG. 17, "R" represents the repaired portion. Both at perimeter and at central portion, a transmissivity over 96% is shown. That is, FIG. 16 shows the recovery of the transmissivity reduction by the wet etching. Here, any acid solution generally employed in the mask fabrication process can be applied to remove the thin chromium film 9b. In the case of this embodiment, for example, the 3:1 solution of sulfuric acid ($H_2SO_4$) and hydrogen peroxide ($H_2O_2$) heated to 105° C. can be used.

As mentioned above, it is possible to repair the isolated defect, which occurred on the chromium mask, by the repairing method of pattern defect according to the fourth embodiment, without generating damage to the mask substrate. In this fourth embodiment, the repairing of mask in which normal square patterns and the isolated defect are disposed is described. However, it is possible to repair the protruding defect from the normal pattern, or the macroscopic defect contacting the edge of normal pattern, in which the effectiveness shown by the first and fourth embodiments are simultaneously achieved.

MANUFACTURING SEMICONDUCTOR DEVICE

Figure 18:
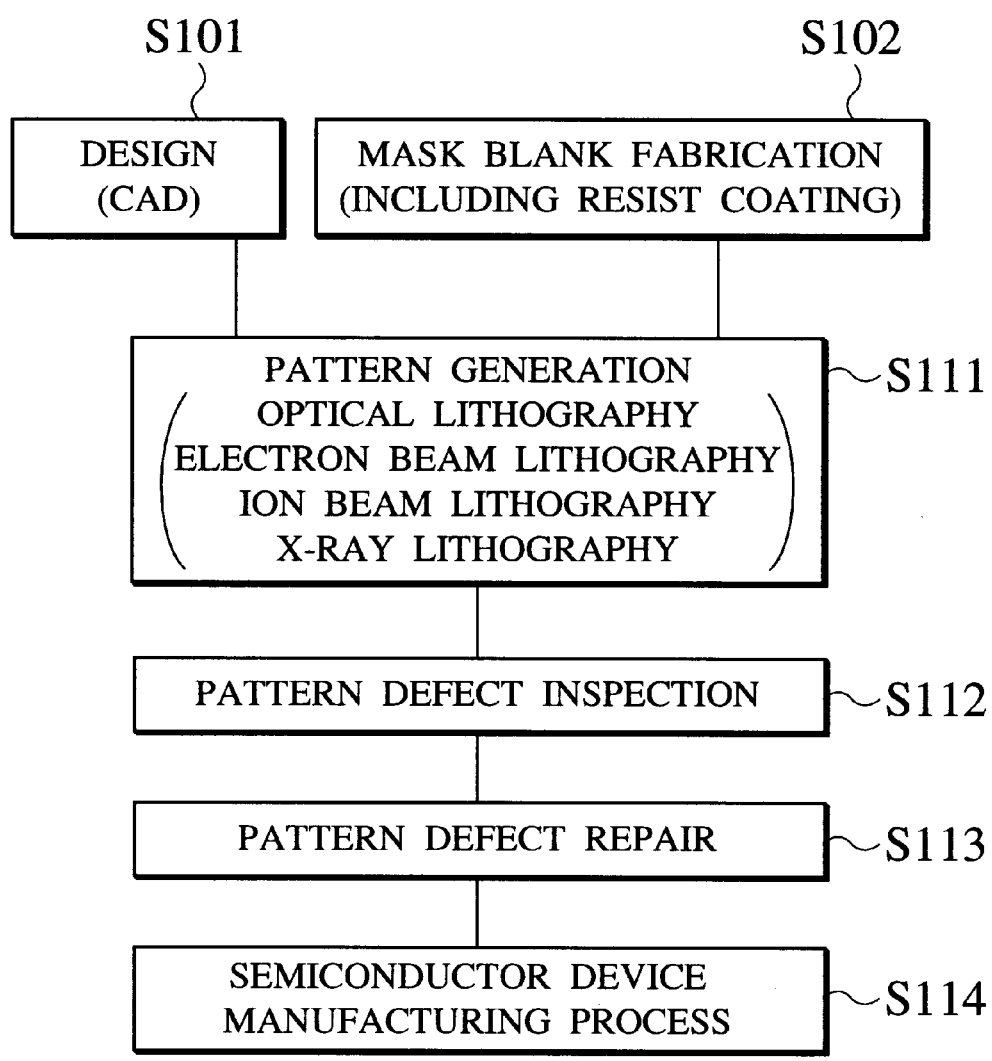
FIG. 18 illustrates a simplified flowchart for manufacturing semiconductor devices.

The mask repaired by the present invention can be employed for manufacturing semiconductor devices such as LSI, VLSI, ULSI, GSI including nMOS FETs, pMOS FETs, CMOS FETs, BJTs or SITs. FIG. 18 shows a simplified flowchart for manufacturing semiconductor devices.

(a) In step S101, the set of layout data for the semiconductor devices such as LSI, VLSI, ULSI, or GSI is designed by computer aided design (CAD) method. On the other hand, in step S102, mask blanks are prepared. For example, on a transparent quartz substrate, an oxide nitride of molybdenum silicide film and a chromium film deposited by CVD method, vacuum evaporation method, or sputtering method. And further, a resist film is coated on a chromium film.

(b) In step S111, using an optical, electron beam, ion beam, or X-ray lithography system, the required set of mask patterns are delineated on the mask blanks prepared by step S102. In this pattern generation step, the set of layout data prepared by the step S101 is employed. And using the delineated resist patterns as etching masks, chromium films and oxides nitride of molybdenum silicide films are cut by RIE, or ion etching, etc. Then the resist films are removed, and the set of photo masks are fabricated.

(c) The fabricated mask patterns are inspected in step S112. And, if the defect is found in any of the set of photo masks, the corresponding defect is repaired in step S113, according to the procedure such as stated in first to fourth embodiments.

(d) After completion of the pattern defect repairing step, the semiconductor device manufacturing process in step S114 is conducted with the set of photo masks, which includes the repaired mask according to one of the first to fourth embodiment.

Figure 19:
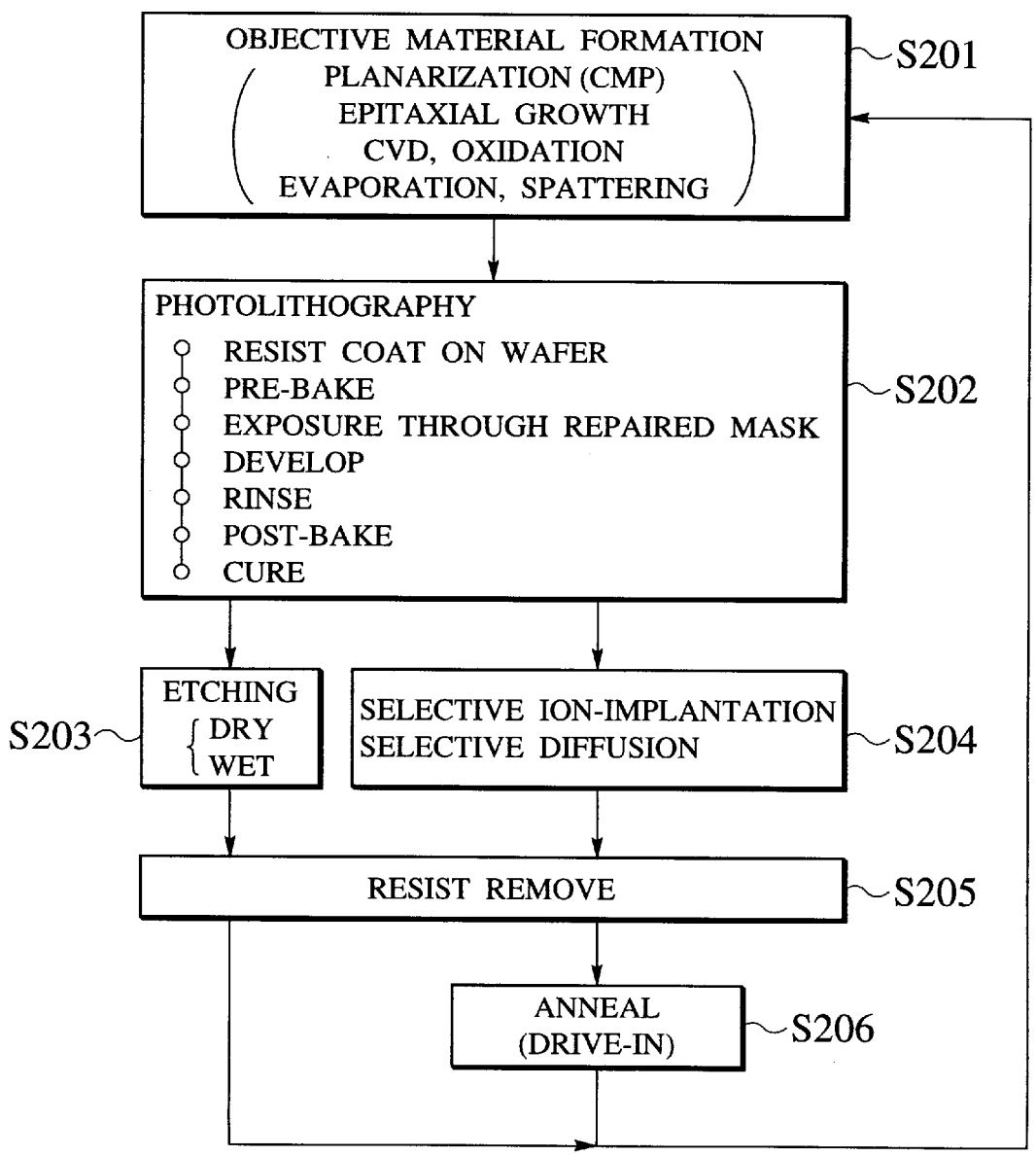
FIG. 19 illustrates details of the semiconductor device manufacturing process.

Details of the semiconductor device manufacturing process in step S114 is shown in FIG. 19.

(a) In step S201, objective materials, such as a semiconductor wafer, insulating film, and conductive film are prepared. The semiconductor wafer may include a silicon wafer, gallium arsenide (GaAs) water, or semiconductor wafers comprising other compounds. The step S201 may include a planarization step of the surface of the wafers by chemical mechanical polishing (CMP), an epitaxial growth step, CVD step, vacuum evaporation step, sputtering step, etc.

(b) Then on the objective materials, a resist film is coated in step S202. In step S202, the following photolithography process is conducted. That is the resist film is pre-baked and exposed by optical lay through the mask repaired by the method according to the present invention. And the resist film is developed, rinsed, post-baked and cured.

(c) And using the resist film delineated by the step S202 as the etching mask, the objective materials are selectively etched in step S203. The selective etching may be conducted by known dry etching or wet etching. On the other hand, using the resist film delineated by step S202 as the diffusion mask (implantation mask), the objective materials may be selectively ion implanted in step 204.

(d) Then the resist film employed in the step S203, or in the step S204 is removed in step S205. After that, in step S206, the semiconductor wafer is annealed. The annealing may include the drive-in process. Further, using the oxide film etched in the step S203 as a diffusion mask, a thermal diffusion process employing the predeposition can also be conducted in step S206. Then, the process flow can return to the above-mentioned step S201 for further depositing thin film on the semiconductor wafer. Then the step S202 is also conducted to proceed to step S203, S204, . . . , and this loop continues until the required structure is completed. If pluralities of loops are repeated according to the prescription of the process design, it is enough that at least one of the steps 202 repeated contains the photolithography process using the repaired mask mentioned in the first to fourth embodiments.

FIG. 20 outlines relatively simple manufacturing processes according to the flow chart shown in FIG. 19. That is, FIG. 20 outlines a simple example of the manufacturing processes of an nMOS FET, which are explained as follows:

(a) First, into an n-type silicon substrate in which phosphorus (P) is already doped, a $Si_3N_4$ film is deposited by a CVD method. And on the $Si_3N_4$ film, resist film is coated. By a first photolithography process employing a mask, which may be the repaired mask by the present invention, a resist film is delineated. And using the resist film as mask, the $Si_3N_4$ film is patterned so that only device regions of the $Si_3N_4$ film are selectively left, and the resist film is removed. Using the $Si_3N_4$ film as an anti-oxidation film, oxidation (LOCOS) is carried out to form device-isolation insulator films with a thickness of 600 nm. Prior to device-isolation oxidation, channel-stop ions of p-type impurity boron ($^{11}B^+$) are implanted at 100 KeV, with dosage of $1\times10^{13}/cm^2$ into regions where the $Si_3N_4$ film was removed, thus preventing inversion of the surface of silicon substrate. In the device-insulation regions where the $Si_3N_4$ film was removed, a thick oxide film of 600 nm is formed, under which a p-type impurity boron ($^{11}B^+$) is introduced to prevent surface inversion. Then, the $Si_3N_4$ film used in LOCOS is removed.

(b) On the $Si_3N_4$ film, another resist film is coated. By a second photolithography process employing another mask (second mask), which may be the repaired mask by the present invention, the resist film is delineated. And using the resist film as mask, into regions which act as active regions (or transistor regions), ions of boron ($^{11}B^+$) are implanted at 100 KeV, with dosage of $1\times10^{13}/cm^2$ to form a p-type well, and the resist film is removed. For the ion implantation of boron, the second mask (second photolithography process) can be omitted, according to the device design. And then the drive-in diffusion is conducted to provide desired depth and concentration.

(c) A thin oxide film of 10 nm thickness, which acts as a dummy oxide film, is formed in the surfaces of the p-type well. And on the dummy oxide film, another resist film is coated. By a third photolithography process employing still another mask (third mask), which may be the repaired mask by the present invention, a resist film is delineated. And using the resist film as mask, through the dummy oxide film are implanted ions of boron ($^{11}B^+$) at 100 KeV, with dosage of $7\times10^{12}/cm^2$ to control the threshold voltage (Vth). And the resist film is removed. For the Vth control ion implantation, the third mask (third photolithography process) can be omitted, according to the device design.

(d) And on the dummy oxide film, still another resist film is coated. By a fourth photolithography process employing still another mask (fourth mask), which may be the repaired mask by the present invention, a resist film is delineated. And using the resist film as mask, ions of boron ($^{11}B^+$) to prevent punch-through are implanted at a higher acceleration energy of 80 KeV, with dosage of $5\times10^{12}/cm^2$ so that high-concentration p-type regions are placed beneath the channel regions. And the resist film is removed. For the punch-through prevention ion implantation, the fourth mask (fourth photolithography process) can be omitted, according to the device design. Further the punch-through prevention ion implantation, by itself, can be omitted, according to the device design.

(e) The dummy oxide film is removed to form a gate oxide film of 10 nm thickness. On that gate oxide film, a polysilicon film, which acts as gate electrodes, is deposited. And on the polysilicon film, still another resist film is coated. By a fifth photolithography process employing still another mask (fifth mask), which may be the repaired mask by the present invention a resist film is delineated. And using the resist film as mask, the polysilicon film is cut by RIE to form the gate electrodes. And the resist film is removed. Further, the patterned polysilicon surfaces are post-oxidized. And on the polysilicon film, still another resist film is coated. By a sixth photolithography process employing still another mask (sixth mask), which may be the repaired mask by the present invention, a resist film is delineated. And using the resist film as a mask, and also using thus patterned and oxidized polysilicon as a mask, ions of n-type impurity arsenic ($^{75}As^+$) are implanted at 30 KeV, with dosage of $5\times10^{15}/cm^2$ into silicon regions which act as source or drain regions. At the same time, the arsenic ($^{75}As^+$) ions are implanted into the polysilicon region, which acts as gate electrodes. And the resist film is removed. For the arsenic ion implantation, the sixth mask (sixth photolithography process) can be omitted, according to the device design, since the arsenic ion implantation is the well-known self-alignment process by nature. After that, the surfaces are covered with a CVD oxide ($SiO_2$) film and undergo heat treatment to activate the arsenic ($^{75}As^+$).

(f) And on the CVD oxide film, still another resist film is coated. By a seventh photolithography process employing still another mask (seventh mask), which may be the repaired mask by the present invention, a resist film is delineated. And using the resist film as a mask contact holes are opened in the CVD oxide film. And the resist film is removed. Further, on the CVD oxide film and into those created openings, Al or other metal is deposited by vacuum evaporation or sputtering. Then, on the CVD oxide film, still another resist film is coated. By an eighth photolithography process employing still another (eighth mask), which may be the repaired mask by the present invention, a resist film is delineated. And using the resist film as mask, this metal is patterned by RIE etc., to form a metal wiring pattern. And the resist film is removed to finish the manufacturing process of nMOS FETs.

In the above manufacturing processes of an nMOS FET, it is enough that at least one of the first to eighth masks is the repaired mask mentioned in the first to fourth embodiments.

Various modifications will become possible for those skilled in the art after receiving the teachings of the present disclosure without departing from the scope thereof.

What is claimed is:

1. A method for repairing a pattern defect comprising:

(a) determining the irradiation area for an ion beam directed towards a defect pattern film material formed on a mask substrate, the defect pattern film material being an opaque material different from a transparent material of the mask substrate, by narrowing the irradiation area by a predetermined distance inwardly from the edge of the defect pattern film material;

(b) focusing the ion beam onto its irradiation area to remove a part of the defect pattern film material from its surface so as to leave a thin layer of the defect pattern film material on the mask substrate, configured such that the ion beam does not attack a surface of the mask substrate; and (c) removing only the thin layer by using a laser beam so as not to ablate a normal pattern film material neighboring the defect pattern film material, the normal pattern film material being made of the opaque material.

2. The method of claim 1, wherein the predetermined distance from the edge of the defect pattern film material is 0.3 nm to 200 nm.

3. The method of claim 1, wherein the predetermined distance from the edge of the defect pattern film material is half of the diameter of the focused ion beam.

4. The method of claim 1, wherein, in the step of focusing the ion beam, a pattern film material formed on the mask substrate at an interface between the defect pattern film material and a normal pattern film material neighboring to the defect pattern film material is completely removed.

5. The method of claim 1, wherein the thin layer has an uneven thickness profile, and its maximum thickness is 1 nm to 30 nm.

6. The method of claim 1, wherein, in the step of removing the thin layer, the irradiation area of the laser beam is so determined as not to overlap the edge of a normal pattern film material.

7. The method of claim 1, wherein the mask substrate is quartz.

8. The method of claim 7, wherein a main component of the defect pattern film material is chromium.

9. The method of claim 8, wherein the defect pattern film material contains a chromium oxide.

10. The method of claim 8, wherein the step of leaving the thin layer is carried out by a gas assisted focused ion beam etching, employing a gas having a etching selectively between the defect pattern film material and the mask substrate.

11. The method of claim 7, wherein a main component of the defect pattern film material is molybdenum silicide.

12. The method of claim 7, wherein a main component of the defect pattern film material is a molybdenum silicide compound.

13. The method of claim 7, wherein the defect pattern film material formed on the mask substrate comprises a first pattern film containing molybdenum suicide and a second pattern film containing chromium, the second pattern film is disposed on the first pattern film.

14. The method of claim 13, wherein the step of leaving the thin layer includes etching the second pattern film by a gas assisted focused ion beam etching, employing a gas having a etching selectively between the second pattern film material and the mask substrate.

15. The method of claim 11, wherein the focused ion beam contains gallium ions and the thin layer contains a gallium doped molybdenum silicide.

16. The method of claim 14, wherein the first pattern film is etched by the gas assisted focused ion beam etching.

17. The method of claim 16, wherein the focused ion beam contains gallium ions and the thin layer contains a gallium doped molybdenum silicide.

18. A photo mask repaired by a method comprising focused ion beam etching so as to leave a thin layer of the defect pattern film material on the mask substrate and removing the thin layer by using a laser beam, the photo mask comprising:

(a) a mask substrate having substantially flat surface; and (b) a pattern delineated on the mask substrate, the pattern has an edge, the edge has a localized specific side wall having an inclination angle differing from that of remaining sidewall, the localized specific side wall representing a repaired portion by the focused ion beam etching and the laser beam removing.

19. The photo mask of claim 18, wherein decrease in the image intensity through said mask substrate neighboring to said specific side wall is not higher than 5% compared with that of other portion.

20. A method for manufacturing a semiconductor device comprising:

(a) generating patterns with a pattern film material on a mask substrate so as to fabricate a photo mask, the pattern film material is an opaque material different from a transparent material of the mask substrate;

(b) inspecting a defect pattern film material made of the pattern film material on the mask substrate;

(c) repairing the defect pattern film material comprising: determining the irradiation area for an ion beam directed towards the defect pattern film material, by narrowing the irradiation area by a predetermined distance inwardly from the edge of the defect pattern film material; focusing the ion beam onto its irradiation area to remove a part of the defect pattern film material from its surface so as to leave a thin layer of the defect pattern film material on the mask substrate, configured such that the ion beam does not attack a surface of the mask substrate; and
removing only the thin layer by using a laser beam so as not ablate a normal pattern film material neighboring the defect pattern film material, the normal pattern film material being made of the opaque material; and (d) fabricating a semiconductor device employing said repaired photo mask.

* * * * *